United States Patent
Watanabe et al.

(10) Patent No.: US 9,733,507 B2
(45) Date of Patent: Aug. 15, 2017

(54) DISPLAY DEVICE AND MANUFACTURING METHOD OF DISPLAY DEVICE

(71) Applicant: Japan Display Inc., Tokyo (JP)

(72) Inventors: Yoshihiro Watanabe, Tokyo (JP); Masanobu Ikeda, Tokyo (JP); Takeo Koito, Tokyo (JP); Koji Ishizaki, Tokyo (JP); Hayato Kurasawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 163 days.

(21) Appl. No.: 14/151,334

(22) Filed: Jan. 9, 2014

(65) Prior Publication Data

US 2014/0232952 A1     Aug. 21, 2014

(30) Foreign Application Priority Data

Feb. 18, 2013   (JP) .................................. 2013-28772

(51) Int. Cl.
    *G02F 1/1333*     (2006.01)
    *G02F 1/1345*     (2006.01)
    (Continued)

(52) U.S. Cl.
    CPC ........ *G02F 1/13338* (2013.01); *G02F 1/1333* (2013.01); *G02F 1/13452* (2013.01);
    (Continued)

(58) Field of Classification Search
    CPC ........ G02F 2001/133302; G02F 2001/133368; G02F 1/133528; G02F 2202/28; H01L 27/1218
See application file for complete search history.

(56) References Cited

U.S. PATENT DOCUMENTS

| | | | | |
|---|---|---|---|---|
| 6,515,729 B1* | 2/2003 | Hoshino | ........... | G02F 1/133305 349/113 |
| 6,853,432 B2* | 2/2005 | Ootsuta | ................. | G02F 1/1333 349/12 |

(Continued)

FOREIGN PATENT DOCUMENTS

| JP | H03175427 A | 7/1991 |
|---|---|---|
| JP | 04-242720 | 8/1992 |

(Continued)

OTHER PUBLICATIONS

Corresponding Japanese Office Action; Application No. 2013-028772; Issue Date: Mar. 1, 2016.

*Primary Examiner* — Paisley L Arendt
(74) *Attorney, Agent, or Firm* — Michael Best & Friedrich LLP

(57) ABSTRACT

Warpage deformation which is caused when substrates having mutually different linear expansion coefficients are bonded to sandwich a display functional layer is suppressed. A display device has a first substrate, a second substrate bonded to the first substrate so as to be opposed to the first substrate, and a liquid crystal layer serving as a display functional layer disposed between the first substrate and the second substrate. Also, a first linear expansion coefficient of the first substrate provided in the display device is larger than a second linear expansion coefficient of the second substrate, and a first thickness of the first substrate is larger than a second thickness of the second substrate.

11 Claims, 18 Drawing Sheets

(51) Int. Cl.
    *H01L 27/12*      (2006.01)
    *G02F 1/1335*     (2006.01)

(52) U.S. Cl.
    CPC ............... *G02F 1/133528* (2013.01); *G02F 2001/133302* (2013.01); *G02F 2001/133368* (2013.01); *G02F 2201/56* (2013.01); *G02F 2202/28* (2013.01); *H01L 27/1218* (2013.01)

(56) References Cited

U.S. PATENT DOCUMENTS

| | | |
|---|---|---|
| 7,248,305 B2 | 7/2007 | Ootsuta et al. |
| 8,027,012 B2 * | 9/2011 | Shimizu ............... C03C 3/078 349/158 |
| 2006/0268200 A1 * | 11/2006 | Ohgaru ............ C09K 19/2007 349/97 |
| 2012/0092817 A1 | 4/2012 | Shibahara et al. |

FOREIGN PATENT DOCUMENTS

| | | |
|---|---|---|
| JP | 09-80405 | 3/1997 |
| JP | 2000194004 A | 7/2000 |
| JP | 2001215528 A | 8/2001 |
| JP | 2002221715 A | 8/2002 |
| JP | 2002250911 A | 9/2002 |
| JP | 2011090251 A | 5/2011 |
| JP | 2012-83597 | 4/2012 |
| JP | 2012230657 A | 11/2012 |
| WO | 2007110995 A1 | 10/2007 |
| WO | 2008001555 A1 | 1/2008 |

* cited by examiner

MISALIGNMENT DISTANCE = L × (ρ1 − ρ2) × Δt

L : SUBSTRATE LENGTH
ρ1 : LINEAR EXPANSION COEFFICIENT OF SUBSTRATE 11
ρ2 : LINEAR EXPANSION COEFFICIENT OF SUBSTRATE 12
Δt : TEMPERATURE CHANGE

DISPLAY DEVICE AND MANUFACTURING METHOD OF DISPLAY DEVICE

CROSS-REFERENCE TO RELATED APPLICATION

The present application claims priority from Japanese Patent Application No. 2013-028772 filed on Feb. 18, 2013, the content of which is hereby incorporated by reference into this application.

TECHNICAL FIELD. OF THE INVENTION

The present invention relates to a display device with an input device and a manufacturing technique thereof, and in particular relates to a display device with an input device using a capacitive sensing method and a manufacturing technique thereof.

BACKGROUND OF THE INVENTION

There is a technique of displaying images in a display device in which a display functional layer such as a liquid crystal layer, an organic EL (Electro-Luminescence) layer, or a fluorescent layer is disposed between a pair of substrates disposed to be opposed to each other. For example, Japanese Patent Application Laid-Open Publication No. 2012-83597 (Patent Document 1) describes a liquid crystal display device using a glass substrate made of strengthened glass. Also, Japanese Patent Application Laid-Open Publication No. H9-80405 (Patent Document 2) describes a liquid crystal display device using metal foil which is formed in a lattice-like shape by etching or electroplating and a glass substrate integrally formed by covering a surface of the metal foil. Further, Japanese Patent Application Laid-Open Publication No. H4-242720 (Patent Document 3) describes a technique in which substrates having mutually different linear expansion coefficients are overlapped with each other in a pressurized state with an ultraviolet curable resin interposed therebetween, a part of the ultraviolet curable resin is irradiated with ultraviolet rays to temporarily fix the substrates, and the temporarily fixed substrates are then irradiated with ultraviolet rays to complete the curing.

SUMMARY OF THE INVENTION

In a structure of a display device used commonly, a cover glass is provided for obtaining the strength of the display device in addition to a pair of substrates bonded and fixed so as to sandwich a display functional layer. However, from the viewpoint of reducing the thickness of the display device and the viewpoint of reducing the number of component parts, a display device which does not need the cover glass is preferred. In recent years, there is a display device with an input device in which data input to electronic equipment is carried out by bringing an input tool such as a finger into contact with or close to a display screen. In the case of this display device with an input device, the distance between the input tool and a detection unit can be shortened by removing the cover glass, so that the position detection sensitivity of the input tool can be improved.

In order to improve the strength of the display device without providing the cover glass, the strength of at least one of the pair of substrates sandwiching the display functional layer has to be increased. Therefore, the inventors of the present application have studied the techniques of using strengthened glass as the substrates sandwiching the display functional layer and have found out the following problems.

For example, in the case where strengthened glass which is chemically strengthened by an ion exchange method is used for the substrates sandwiching the display functional layer, the strength of the substrates made of the strengthened glass can be significantly improved. Therefore, the strength of the display device can be improved without providing the cover glass.

However, the chemically strengthened glass substrate contains alkali metal ions such as sodium ions and potassium ions therein. If the chemically strengthened substrate is used as a substrate to form thin film transistors (TFT), the alkali metal ions eluted to the TFT layer may damage the TFT. Therefore, in the case where a TFT layer is formed on one of the pair of substrates sandwiching the display functional layer, it is preferred that the substrate to form the TFT layer is made of alkali-free glass to which no chemical strengthening treatment is performed and the substrate opposed to the substrate to form the TFT layer is subjected to the chemical strengthening treatment.

Also, the chemically strengthened glass and the alkali-free glass to which no chemical strengthening treatment is performed have different linear expansion coefficients. Therefore, in the case where one of the substrates is made of chemically strengthened glass and the other substrate is made of alkali-free glass as described above, the substrates having mutually different linear expansion coefficients are to be bonded and fixed. In this case, when the substrates are heated after being bonded and fixed, warpage deformation of the substrates, peel-off of bond fixing parts, and display failures due to the misalignment of the substrates may occur.

The present invention has been made in view of the above-described problems, and an object of the present invention is to provide techniques for suppressing the warpage deformation which occurs when substrates having different linear expansion coefficients are bonded and fixed so as to sandwich a display functional layer.

A display device according to the present invention has a first substrate, a second substrate bonded and fixed to the first substrate so as to be opposed to the first substrate, and a display functional layer disposed between the first substrate and the second substrate. Also, a first linear expansion coefficient of the first substrate is larger than a second linear expansion coefficient of the second substrate, and a first thickness of the first substrate is larger than a second thickness of the second substrate.

In the above-described display device according to the present invention, the warpage deformation which occurs when substrates having different linear expansion coefficients are bonded and fixed so as to sandwich a display functional layer can be suppressed.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof will be omitted in principle.

In the following descriptions of the embodiments, a liquid crystal display device provided with a liquid crystal layer serving as a display functional layer is taken as an example of a display device.

FIG. 2, FIG. 3, FIG. 9, FIG. 11, FIG. 13, FIG. 15, FIG. 18, FIG. 22, and FIG. 24 described in the following embodiments are cross-sectional views, but hatching is basically omitted therein for making the drawings easy to see. Also, in FIG. 3, FIG. 9, and FIG. 22, liquid crystal LC constituting a liquid crystal layer 16 is schematically shown by an elliptical shape. Further, many identical members are provided in FIG. 3, FIG. 9, and FIG. 22, but a symbol is given to one of the plurality of members and the other same members are denoted with common hatching for making the drawings easy to see.

First Embodiment

<Basic Structure of Display Device>

Figure 1:
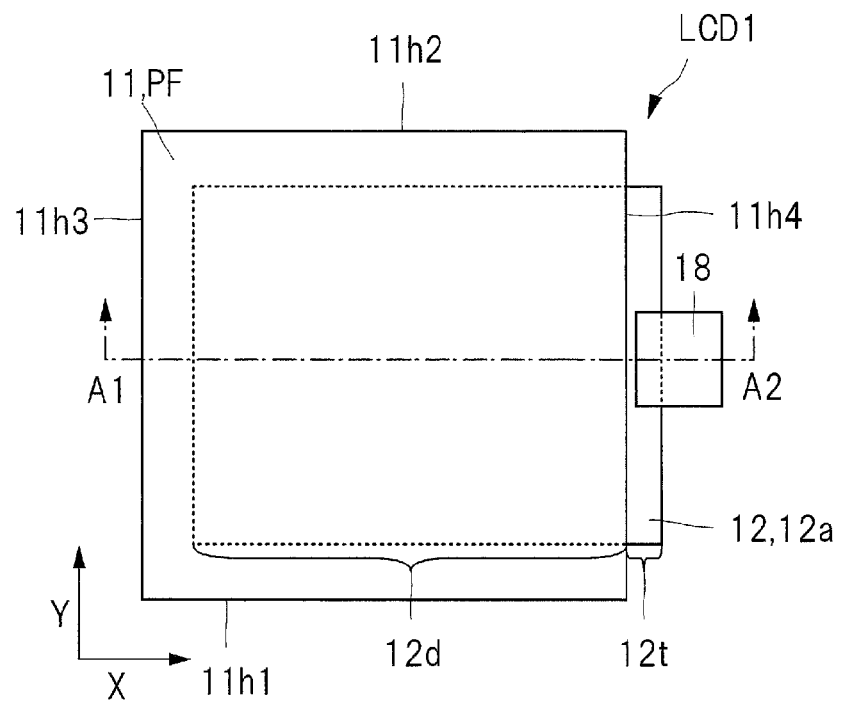
FIG. 1 is a plan view showing an example of a display device of a first embodiment.
Figure 2:
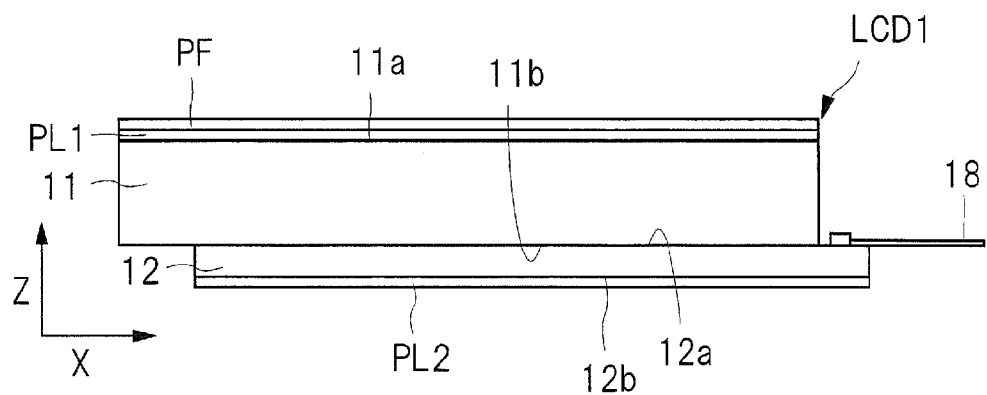
FIG. 2 is a cross-sectional view taken along a line A1-A2 of FIG. 1.
Figure 3:
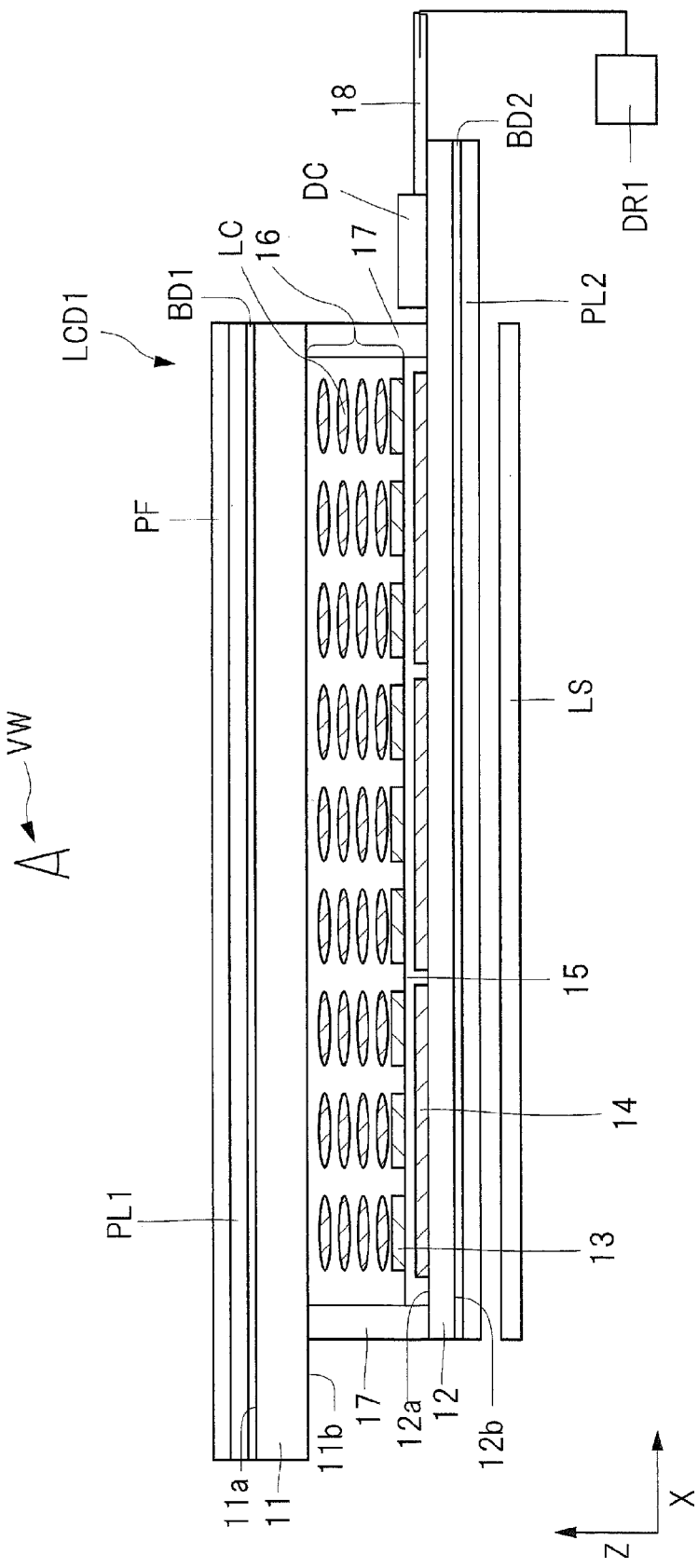
FIG. 3 is a cross-sectional view schematically showing a structure of a display functional layer disposed between a pair of substrates shown in FIG. 2.
Figure 4:
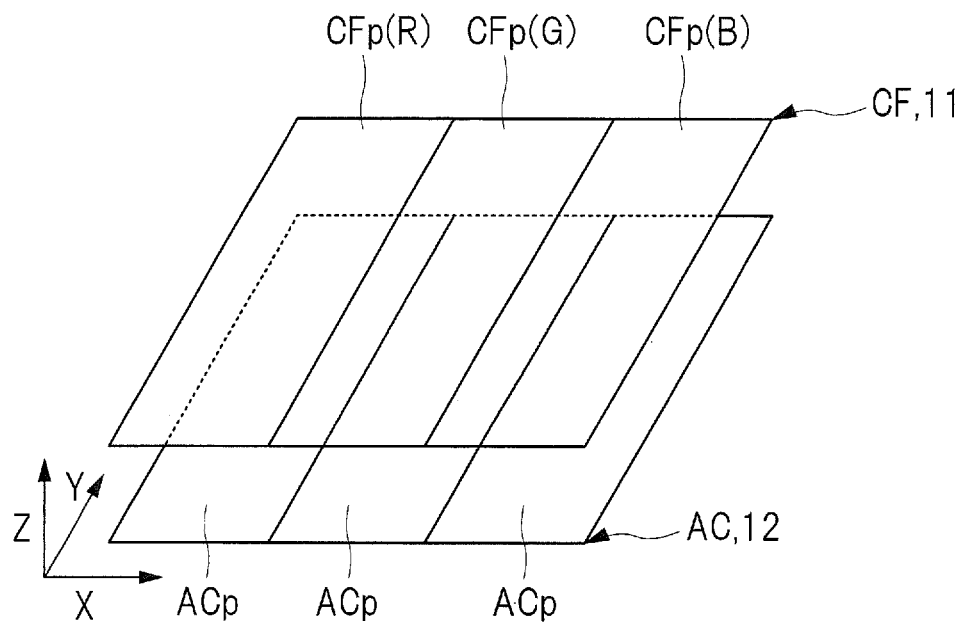
FIG. 4 is a perspective view schematically showing a state in which pixels formed in each of the opposed substrates shown in FIG. 3 are overlapped.
Figure 5:
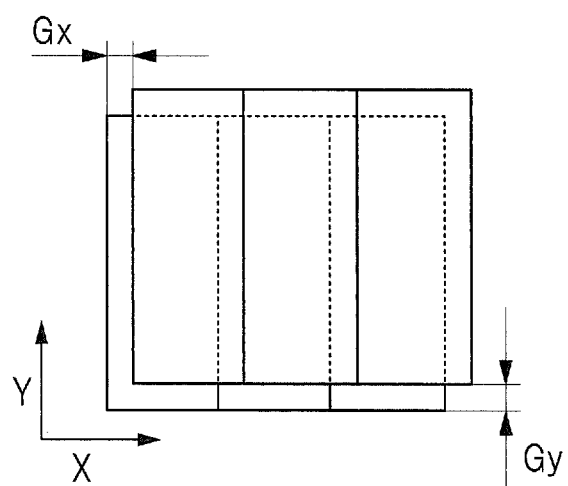
FIG. 5 is a plan view showing the pixels in FIG. 4 seen from a Z direction.

First, a basic structure of a display device will be described. FIG. 1 is a plan view showing an example of the display device of the present embodiment, and FIG. 2 is a cross-sectional view taken along a line A1-A2 of FIG. 1. Also, FIG. 3 is a cross-sectional view schematically showing the structure of a display functional layer disposed between a pair of substrates shown in FIG. 2. FIG. 4 is a perspective view schematically showing a state in which pixels formed in each of the opposed substrates shown in FIG. 3 are overlapped. FIG. 5 is a plan view showing the pixels in FIG. 4 seen from a Z direction.

The liquid crystal layer 16 serving as a display functional layer shown in FIG. 3 is extremely thin compared with a substrate 11 and a substrate 12. For example, the thickness of the substrate 11 is 0.2 mm or more to 5.0 mm or less and the thickness of the substrate 12 is 0.1 mm or more to 1.5 mm or less, while the thickness of the liquid crystal layer 16 is about 5 μm or more to 15 μm or less. Therefore, in FIG. 3, the liquid crystal layer 16 is shown so as to have a larger thickness than an actual thickness, thereby making the structure of the liquid crystal layer 16 easy to see.

The liquid crystal display device is roughly classified into the following two kinds in accordance with an applying direction of an electric field for changing an orientation of liquid crystal molecules of a liquid crystal layer serving as a display functional layer. That is, the first classification is a so-called vertical electric field mode in which an electric field is applied in a thickness direction (out-of-plane direction) of a liquid crystal display device. The vertical electric field mode includes, for example, a TN (Twisted Nematic) mode and a VA (Vertical Alignment) mode. Also, the second classification is a so-called horizontal electric field mode in which an electric field is applied in a plane direction (in-plane direction) of a liquid crystal display device. The horizontal electric field mode includes, for example, an IPS (In-Plane Switching) mode and an FFS (Fringe Field Switching) mode. The technique described below is applicable to any of the vertical electric field mode and the horizontal electric field mode, and the display device of the horizontal electric field mode (FFS mode in detail) is shown as an example in FIG. 3.

A display device LCD1 shown in FIG. 1 to FIG. 3 is provided with a substrate 11 having a front surface 11a disposed on a display surface side (or viewer VW side shown in FIG. 3) and a substrate 12 disposed on an opposite side of the front surface 11a of the substrate 11 so as to separate from the substrate 11. Also, as shown in FIG. 3, the display device LCD1 is further provided with a plurality of pixel electrodes 13 arranged between the substrate 11 and the substrate 12 and common electrodes 14 arranged between the substrate 11 and the substrate 12. In addition, the display device LCD1 is further provided with the liquid crystal layer 16 which is disposed between the substrate 11 and the substrate 12 and serves as a display functional layer on which a display image is formed by applying a display voltage between the plurality of pixel electrodes 13 and the plurality of common electrodes 14.

The substrate 11 shown in FIG. 3 is a color filter substrate in which color filters CF (see FIG. 4) which form an image of a color display are formed, and has the front surface 11a that is the display surface side and a back surface 11b located on the opposite side of the front surface 11a. To the substrate 11, color filters in which color-filter pixels CFp (see FIG. 4) having three colors of red (R), green (G) and blue (B) are cyclically arranged on one surface of a base material such as a glass substrate are attached. In a color display device, for example, one pixel is made from one set of the sub pixels (color-filter pixels CFp shown in FIG. 4) of these three colors of red (R), green (G), and blue (B).

Also, the substrate (or array substrate) 12 shown in FIG. 3 is a circuit board on which circuits for image display are mainly formed, and has a front surface (or side, inner surface) 12a located on the substrate 11 side and a back surface (or side, rear surface) 12b located on the opposite side thereof. On the front surface 12a side of the substrate 12, active elements AC (see FIG. 4) such as a TFT (Thin-Film Transistor) and a plurality of pixel electrodes 13 are formed in a matrix form. As shown in FIG. 4, a plurality of active-element pixels ACp formed on the substrate 12 and the plurality of color-filter pixels CFp of the substrate 11 are disposed at mutually opposed positions.

Also, since the display device LCD1 of the horizontal electric field mode (specifically, FFS mode) is shown in the example of FIG. 3 as described above, the common electrodes 14 are formed on the front surface 12a side of the substrate 12. The common electrodes 14 are formed on the front surface 12a of the substrate 12, and an insulating layer 15 is stacked on the common electrodes 14. The plurality of pixel electrodes 13 are formed on the insulating layer 15 so as to be opposed to the common electrodes 14 via the insulating layer 15. In the display device LCD1, a pixel voltage is applied to the pixel electrodes 13 and a common drive voltage is applied to the common electrodes 14 in a display period, thereby determining the display voltage of each pixel.

Though not shown, other than those mentioned above, a display driver for driving the pixel electrodes 13 and wirings such as a source line for supplying a pixel signal to the pixel electrodes 13 and a gate line for driving the TFTs are formed on the substrate 12.

Further, between the substrate 11 and the substrates 12, the liquid crystal layer 16 that is a display functional layer on which a display image is formed by applying a display voltage between the pixel electrodes 13 and the common electrodes 14 is provided. The liquid crystal layer 16 modulates light which passes therethrough in accordance with a status of the applied electric field, and the liquid crystal LC corresponding to various modes such as the TN, the VA, and the FFS is used for the liquid crystal layer 16. Note that, though not shown, an alignment film is formed each between the liquid crystal layer 16 and the substrate 11 and between the liquid crystal layer 16 and the substrate 12.

Around the liquid crystal layer 16, a seal member 17 is disposed so as to surround the liquid crystal layer 16, and the liquid crystal layer 16 is sealed in a region surrounded by the seal member 17. Also, the substrate 11 and the substrate 12 are bonded and fixed via the seal member 17. More specifically, the seal member 17 has a function as a seal member for preventing leakage of the liquid crystal layer 16 and a function as a bonding member for bonding and fixing the substrate 11 and the substrate 12. As described above, in FIG. 3, in order to make the liquid crystal layer 16 easy to see, the thickness of the liquid crystal layer, that is, the length in the Z direction shown in FIG. 3 is made larger than the actual thickness. The thickness of the liquid crystal layer 16 is about 1/100 of the thickness of the substrate 12 and is, for example, 5 or more to 15 μm or less. Therefore, the height of the seal member 17 (in other words, the length in the Z direction shown in FIG. 3) is about 1/100 of the thickness of the substrate 12 and is, for example, 5 μm or more to 15 μm or less.

On the back surface 12b side of the substrate 12 of the display device LCD1, a light source LS and a polarization plate PL2 which filters the light generated from the light source LS are provided. The polarization plate PL2 is bonded and fixed to the substrate 12 via a bonding layer BD2. On the other hand, on the front surface 11a side of the substrate 11, a polarization plate PL1 which filters the light which has passed through the substrate 11 is provided. The polarization plate PL1 is bonded and fixed to the substrate 11 via a bonding layer BD1. Although details will be described later, in the display device LCD1, the strength of the substrate 11 is improved more than the strength of the substrate 12, thereby improving the strength of the whole display device LCD1. Therefore, no cover glass is disposed on the display surface side, and a protective film PF is bonded and fixed as a protective layer for protecting the polarization plate PL1 from damage, stains, and others so as to cover the polarization plate PL1.

From a viewpoint of the display function of the display device LCD1, it is not always necessary to provide the protective film PF. However, from a viewpoint of suppressing the reduction in display performance caused by scratches formed on or stains adhered to the polarization plate PL1, it is preferred to provide the protective film PF. The protective film PF is, for example, a resin film, and the thickness thereof is smaller than the thickness of the substrate 12. For example, the thickness of the substrate 12 is 0.1 mm or more to 1.5 mm or less as described above, while the thickness of the protective film PF is about 10 μm or more to 500 μm or less. Also, since the thickness of each of the polarization plate PL1 and the polarization plate PL2 is about 60 μm or more to 500 μm or less, the thickness of the protective film PF is almost equal to each of the thicknesses of the polarization plate PL1 and the polarization plate PL2. According to the present embodiment, since the strength necessary for the display device LCD1 can be ensured by the substrate 11, the thickness of the protective film PF can be reduced as described above. As a modification example of FIG. 3, instead of the protective film PF or in addition to the protective film PF, a decorative film may be provided.

FIG. 3 shows the embodiment in which the polarization plate PL1 and the polarization plate PL2 are attached to the substrate and the substrate 12, respectively. However, various modification examples can be applied. For example, an embodiment in which an optical film such as a retardation plate is attached in addition to the polarization plate PL1 and the polarization plate PL2 can be applied. Alternatively, a method in which optical films are formed on the substrate 11 and the substrate 12, respectively, can be applied.

Also, in the example shown in FIG. 3, a semiconductor chip (driver chip) DC in which a drive circuit which supplies a pixel voltage to the pixel electrodes 13 is formed and a wiring board 18 coupled to a drive circuit DR1 for image display are coupled to the front surface 12a of the substrate 12. The wiring board 18 is a so-called flexible circuit board which has a plurality of wirings formed in a resin film and can be freely deformed in accordance with the shape of an arrangement place. The wirings formed in the wiring board 18 include a wiring coupled to the pixel electrodes 13 and a wiring coupled to the common electrodes 14. Note that, in the example shown in FIG. 3, an embodiment of a so-called COG (Chip on glass) method in which a semiconductor chip is mounted on the substrate 12 is shown, but a place where a semiconductor chip is mounted is not limited to that on the substrate 12, and the method in which the semiconductor chip is mounted on the wiring board 18 is also applicable.

A display method of a color image by the display device LCD1 shown in FIG. 3 is as follows. That is, the light emitted from the light source LS is filtered by the polarization plate PL2, and the light having an amplitude which transmits through the polarization plate PL2 enters the liquid crystal layer 16. The light which has entered the liquid crystal layer 16 is propagated in a thickness direction of the liquid crystal layer 16 (or direction toward the substrate 11 from the substrate 12), while changing a polarization state in accordance with refractive index anisotropy (or birefringence) of the liquid crystal LC, and is then emitted from the substrate 11. At this time, a liquid crystal orientation is controlled by the electric field formed by applying a voltage to the pixel electrode 13 and common electrode 14, and the liquid crystal layer 16 functions as an optical shutter. More specifically, in the liquid crystal layer 16, it is possible to control the transmittance of light for each sub pixel. To the light which has reached the substrate 11, the color filtering process (process of absorbing light having a wavelength other than a predetermined wavelength) is performed by the color filter formed on the substrate 11, and the light is then emitted from the front surface 11a. Also, the light emitted from the front surface 11a is filtered by the polarization plate PL1, and reaches the viewer VW.

Since the display device LCD1 employs an image display method as described above, from a viewpoint of improving display quality, it is preferred to reduce the misalignment distances between the color-filter pixels CFp formed on the substrate 11 and the active-element pixels ACp formed on the substrate 12.

The sizes of the color-filter pixels CFp and the active-element pixels ACp are different depending on the required definition. For example, in the example shown in FIG. 4, the X-direction length thereof is about 15 μm or more to 100 μm or less, and the Y-direction length thereof is about 50 μm or more to 200 μm or less. In the present embodiment, the X-direction misalignment distance Gx between the color-filter pixels CFp and the active-element pixels ACp and the misalignment distance Gy therebetween in the Y direction orthogonal to the X direction shown in FIG. 5 are 5 μm or less. If the sizes of the color-filter pixels CFp and the active-element pixels ACp are within the above-described range, the display quality of the display device LCD1 shown in FIG. 1 to FIG. 3 can be improved by causing each of the misalignment distance Gx and the misalignment distance Gy to be 5 μm or less. A method of causing each of the misalignment distance Gx and the misalignment distance Gy to be 5 μm or less will be described later.

<Relation Between Strength of Display Device and Warpage Deformation>

Next, the strength of the display device LCD1 shown in FIG. 1 to FIG. 3 will be described. As described above, in a structure of a display device used commonly, a cover glass is provided for obtaining the strength of the display device in addition to a pair of substrates bonded and fixed so as to sandwich a display functional layer. However, from the viewpoint of reducing the thickness of the display device and the viewpoint of reducing the number of component parts, a display device which does not need the cover glass is preferred.

Therefore, the inventors of the present application have studied the techniques for improving the strength of a glass substrate used in the display device. As a method of strengthening the glass substrate, there is a chemical strengthening method in which the alkali ions comprised in the glass substrate are exchanged with alkali ions having larger ionic radii by utilizing an ion exchange method, thereby forming a compressive stress layer on the surface of the glass substrate. As a strengthening method of the glass substrate other than the chemical strengthening, there is a method in which the surface of the glass substrate is heated to near the softening point and then rapidly cooled to give a difference in the contraction speed between the glass surface and its interior, thereby forming a compressive stress layer (hereinafter, referred to as physical strengthening). The chemical strengthening is more advantageous than the physical strengthening if the thickness of the glass substrate is small. Also, the chemical strengthening is more advantageous than the physical strengthening in a point that the compressive stress layer can be easily uniformized.

However, since a chemically strengthened glass substrate contains alkali metal ions such as sodium ions and potassium ions therein, when the TFT is formed on the substrate, the alkali metal ions eluted to the TFT layer may damage the TFT. Therefore, since the TFT layer is formed on the front surface 12a side as described above, from the viewpoint of protecting the TFT layer, it is preferred that a so-called alkali-free glass in which the concentration of alkali components comprised in the glass substrate is low (for example, 1 wt % or less) is used for the substrate 12 shown in FIG. 3.

On the other hand, since no TFT layer is formed in the substrate 11, it is preferred to use a chemically strengthened glass substrate. Thus, in the present embodiment, a chemically strengthened glass substrate is used as the substrate 11, and a glass substrate of alkali-free glass to which no chemical strengthening treatment is performed is used as the substrate 12. In other words, of the substrate 11 and the substrate 12 bonded and fixed so as to sandwich the liquid crystal layer 16 serving as the display functional layer, chemically strengthened glass is used for the substrate 11, so that the strength of the display device LCD1 is improved.

Therefore, in the example shown in FIG. 3, the concentration of the alkali components comprised in the substrate 11 is higher than the concentration of the alkali components comprised in the substrate 12. In other words, the substrate 11 is a glass substrate comprising the alkali components at a first concentration, and the substrate 12 is a glass substrate comprising the alkali components at a second concentration lower than the first concentration or is a glass substrate comprising no alkali components.

From the viewpoint of improving the strength of the display device LCD1 shown in FIG. 1 to FIG. 3, it is only necessary to improve the strength of at least either one of the substrate 11 and the substrate 12. Therefore, the strength of the display device LCD1 can be improved by performing the chemical strengthening treatment to the substrate 11 as described in the present embodiment. Also, by using the alkali-free glass for the substrate 12, damage on the TFT layer due to the elution of the alkali components can be suppressed.

However, as a result of further studies carried out by the inventors of the present application, it has been found out that, when glass substrates to which different treatments are performed are used as the substrates 11 and 12, warpage deformation of the substrates 11 and 12 occurs due to the difference in the linear expansion coefficient between the substrates 11 and 12. For example, the linear expansion coefficient of the substrate 11 to which the chemical strengthening treatment is performed is about $1 \times 10^{-5}$ [1/K]. On the other hand, the linear expansion coefficient of the substrate 12 which is alkali-free glass is about $4 \times 10^{-6}$ [1/K]. In the case where the linear expansion coefficient of the substrate 11 is larger than the linear expansion coefficient of the substrate 12 as described above, when the substrate 11 and the substrate 12 are heated after being bonded and fixed, warpage deformation occurs so that a center part of the front surface 11a of the substrate 11 projects toward the viewer VW.

If the warpage deformation occurs in the substrates 11 and 12, depending on the degree of the warpage deformation, the seal member 17 serving as a fixing part for fixing and bonding the substrate 11 and the substrate 12 may be peeled off. Also, depending on the degree of the warpage deformation, the misalignment distance Gx and the misalignment distance Gy shown in FIG. 5 are increased, which may cause the reduction in display quality.

Therefore, the inventors of the present application have studied the techniques for suppressing the warpage deformation and found out that the warpage deformation can be suppressed when the substrate 11 and the substrate 12 have mutually different thicknesses. Specifically, as shown in FIG. 3, the thickness of the substrate 11 having the relatively large linear expansion coefficient is made larger than the thickness of the substrate 12 having the relatively small linear expansion coefficient. In other words, the thickness of the substrate 12 having the relatively small linear expansion coefficient is made smaller than the thickness of the substrate 11 having the relatively large linear expansion coefficient. As described above, the thickness of the substrate 11 is 0.2 mm or more to 5.0 mm or less, particularly preferably 0.5 mm or more to 3.0 mm or less. On the other hand, the thickness of the substrate 12 is 0.1 mm or more to 1.5 mm or less, particularly preferably 0.15 mm or more to 0.7 mm or less, and is smaller than the thickness of the substrate 11.

Figure 6:
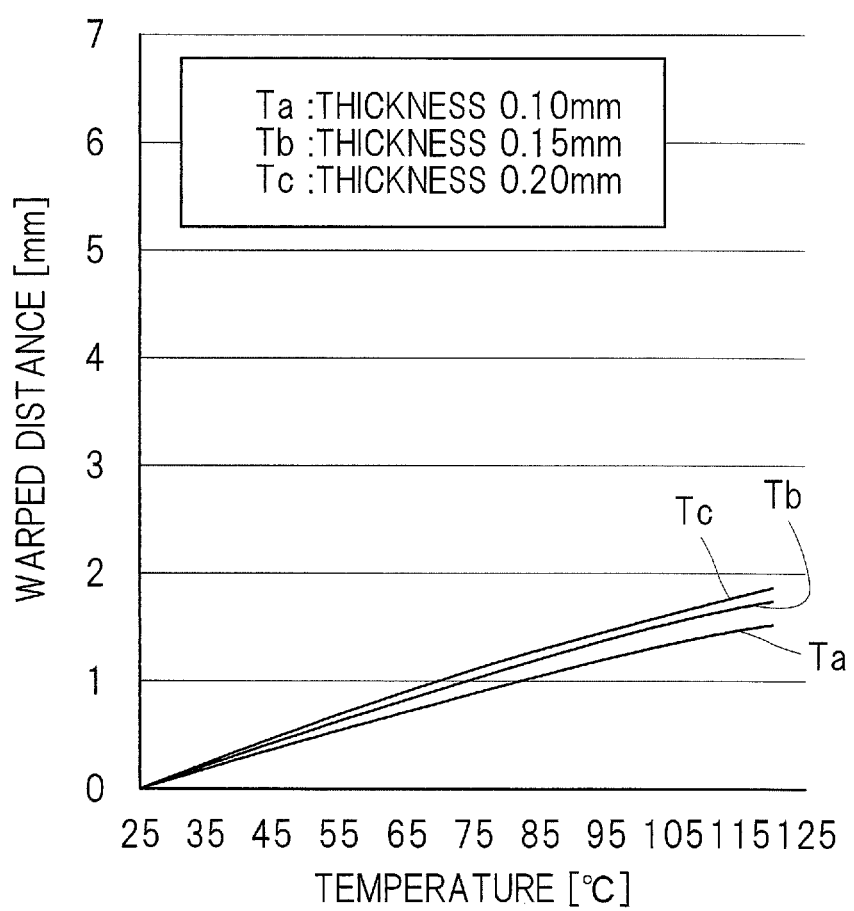
FIG. 6 is an explanatory drawing showing results of calculations carried out for the relation between the thickness and warped distance of glass substrates.
Figure 7:
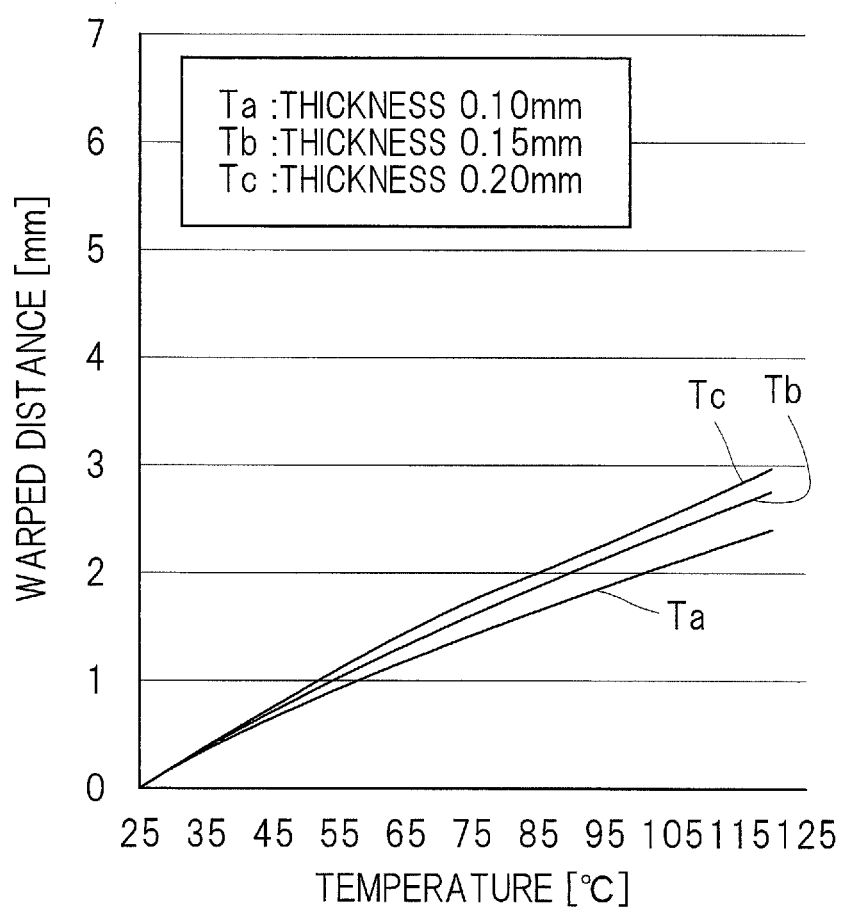
FIG. 7 is an explanatory drawing showing results of calculations carried out for the relation between the thickness and warped distance of glass substrates subsequently to FIG. 6.
Figure 8:
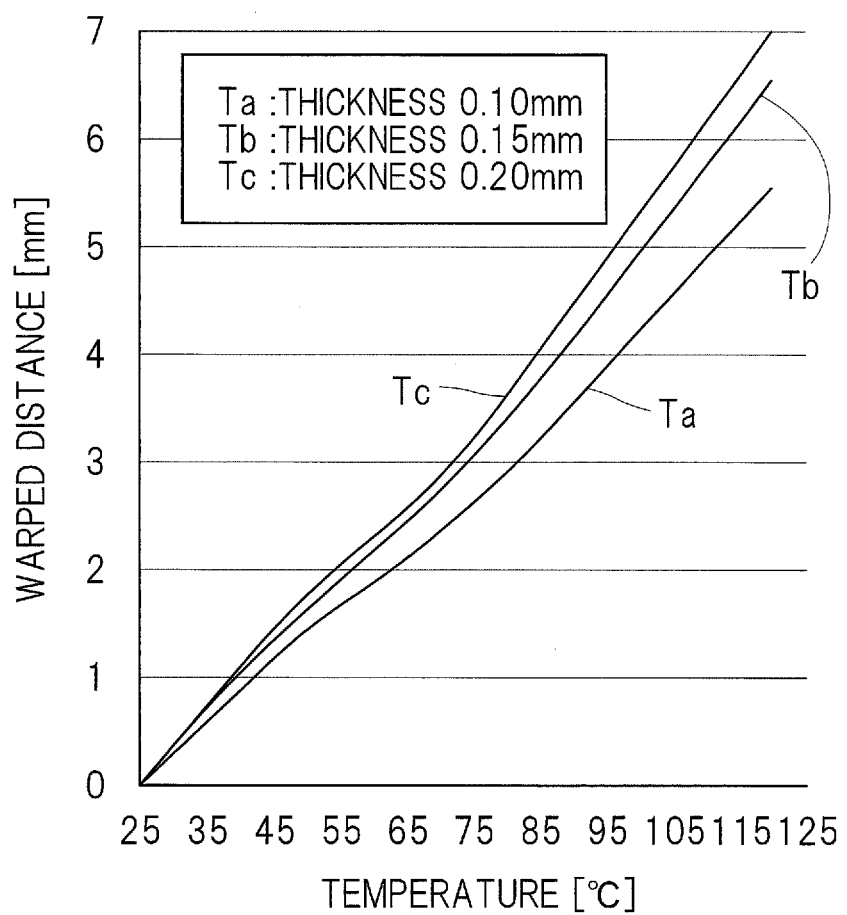
FIG. 8 is an explanatory drawing showing results of calculations carried out for the relation between the thickness and warped distance of glass substrates subsequently to FIG. 7.

When the thickness of the substrate 12 having the relatively small linear expansion coefficient is reduced in this manner, the force against the tensile force which the substrate 12 receives from the substrate 11 due to heat effect is decreased. Therefore, the followability of the substrate 12 with respect to the substrate 11 is improved, and the warpage deformation can be suppressed. FIG. 6 to FIG. 8 show the results of calculations carried out by the inventors of the present application about the relation between the thickness and warped distance of the glass substrates. In FIG. 6 to FIG. 8, vertical axes represent the warped distance and show the height difference between the center and the periphery of the front surface 11a of the substrate 11 shown in FIG. 3. Horizontal axes represent the temperature of heating carried out after fixing and bonding the substrate 11 shown in FIG. 3. Also, FIG. 6 to FIG. 8 show the warped distances in the cases in which the thickness of the substrate 12 is 0.10 mm (symbol Ta), 0.15 mm (symbol Tb), and 0.20 mm (symbol Tc) when the thickness of the substrate 11 shown in FIG. 3 is 0.5 mm. Further, in the results shown in FIG. 6 to FIG. 8, the size of the display region of the display device LCD1 is mutually different. More specifically, the calculation result in the case where the diagonal distance of the display region is 5 inches (12.7 cm) is shown in FIG. 6, the calculation result in the case where the diagonal distance of the display region is 7 inches (17.78 cm) is shown in FIG. 7, and the calculation result in the case where the diagonal distance of the display region is 10 inches (25.4 cm) is shown in FIG. 8.

As can be seen from FIG. 6 to FIG. 8, the smaller the thickness of the substrate 12 shown in FIG. 3 becomes, the more the warped distance can be reduced. Thus, it can be understood that the degree of the warpage deformation can be suppressed by reducing the thickness of the substrate 12 having the relatively small linear expansion coefficient. Also, as can be seen from the comparison of FIG. 6 to FIG. 8, the longer the diagonal distance of the display region becomes, the larger the temperature dependency of the warped distance becomes. Therefore, in the case where the distance of the display region is longer than 5 inches, it is particularly preferred to reduce a heating temperature after the substrate 11 and the substrate 12 are bonded and fixed in the manufacturing process.

Also, as shown in FIG. 1, in the display device LCD1 of the present embodiment, the area of the substrate 11 is larger than the area of the substrate 12 and most part of the substrate 12 is covered with the substrate 11 when seen in a plan view. Specifically, when seen in a plan view, the substrate 11 has a side 11h1 extending along the X direction, a side 11h2 opposed to the side 11h1, a side 11h3 intersecting with the side 11h1 and the side 11h2, and a side 11h4 opposed to the side 11h3. Moreover, when seen in a plan view, the side 11h1, the side 11h2, and the side 11h3 are disposed at the positions which are not overlapped with the substrate 12. Specifically, the entirety of the side 11h1 is disposed outside the periphery of the substrate 12, the entirety of the side 11h2 is disposed outside the periphery of the substrate 12, and the entirety of the side 11h3 is disposed outside the periphery of the substrate 12. On the other hand, in the example shown in FIG. 1, part of the side 11h4 is disposed inside the periphery of the substrate 12, in other words, at a position overlapped with the substrate 12.

The above-described tensile force which causes the warpage deformation is generated when stress is concentrated due to the difference in heat expansion amounts at the heating of the substrate 11 and the substrate 12 or heat contraction amounts after the heating. The stress generated by heat expansion or heat contraction becomes largest at the periphery of the substrate 11.

When the side 11h1, the side 11h2, and the side 11h3 are disposed at the positions which are not overlapped with the substrate 12 when seen in a plan view as shown in FIG. 1, the periphery of the substrate 11 at which the stress is largest is disposed outside the substrate 12, so that the stress applied to the bond fixing part of the substrate 11 and the substrate 12 can be reduced. Moreover, by disposing the side 11h1, the side 11h2, and the side 11h3 at the positions not overlapped with the substrate 12, the peripheral part of the substrate 11 to which the largest stress is applied can be excluded from the display region of the substrate 12. In the example shown in FIG. 1, the side 11h4 of the substrate 11 is disposed at the position overlapped with the substrate 12, and this is for the purpose of ensuring the disposing space of the semiconductor chip DC and the wiring board 18. The substrate 12 is provided with a display part 12d having the display region and a terminal part 12t disposed next to the display part 12d and having a plurality of terminals (not shown) coupling the semiconductor chip DC (see FIG. 3) and the wiring board 18 disposed therein. In the example shown in FIG. 1, the substrate 11 is overlapped with the substrate 12 so as to cover the entirety of the display part 12d and expose the terminal part 12t. However, although details will be described later, the side 11h4 of the substrate 11 can also be disposed at a position not overlapped with the substrate 12 as a modification example of FIG. 1.

Also, in the case where the polarization plate PL1 and the polarization plate PL2 are bonded and fixed to the substrate 11 and the substrate 12, respectively, as shown in FIG. 3, the same material can be used for the bonding layer BD1 for bonding the polarization plate PL1 and the bonding layer BD2 for bonding the polarization plate PL2. However, from the viewpoint of suppressing the warpage deformation, mutually different materials can be used for the bonding layer BD1 and the bonding layer BD2. Specifically, it is preferred that the elastic modulus of the bonding layer BD1 is higher than the elastic modulus of the bonding layer BD2. The elastic modulus is a physical property value representing the difficulty of deformation, and the physical property value representing difficulty of deformation with respect to tensile force is particularly referred to as Young's modulus. In short, the bonding layer BD1 having the relatively high elastic modulus is less likely to be deformed compared with the bonding layer BD2.

In the case where the elastic modulus of the bonding layer BD1 is made higher than the elastic modulus of the bonding layer BD2, the bonding layer BD1 which is less likely to be deformed is bonded to the substrate 11 having the relatively large linear expansion coefficient. On the other hand, the bonding layer BD2 which is easily deformed is bonded to the substrate 12 having the relatively small linear expansion coefficient. Therefore, stress is generated in the direction in which the stress generated due to the difference in the linear expansion coefficient between the substrate 11 and the substrate 12 is cancelled out. As a result, since the stress generated at the bond fixing part of the substrate 11 and the substrate 12 can be reduced, warpage deformation and peel-off of the seal member 17 can be further suppressed.

Alternatively, the total thickness of the members bonded to the substrate 11 and the total thickness of the members bonded to the substrate 12 may be made different from each other so that stress is generated in the direction in which the stress generated due to the difference in the linear expansion coefficient between the substrate 11 and the substrate 12 is cancelled out. For example, in the example shown in FIG. 3, since the polarization plate PL1 and the protective film PF are stacked on the front surface 11a of the substrate 11 via the bonding layer BD1, the total thickness of the members bonded to the substrate 11 is, for example, 75 μm or more to 1,050 μm or less. On the other hand, since the polarization plate PL2 is bonded and fixed to the back surface 12b of the substrate 12 via the bonding layer BD2, the total thickness of the members bonded to the substrate 12 is, for example, 65 μm or more to 550 μm or less, and is smaller than the total thickness of the members bonded to the front surface 11a of the substrate 11.

For example, in the case where the bonding layer BD1 and the bonding layer BD2 are formed of the same material and the polarization plate PL1 and the polarization plate PL2 are formed of the same material, the thicker the members bonded to each of the substrate 11 and the substrate 12 become, the less the deformation occurs. Therefore, when the total thickness of the members bonded to the substrate 11 is made larger than the total thickness of the members bonded to the substrate 12, stress can be generated in the direction in which the stress generated due to the difference in the linear expansion coefficient between the substrate 11 and the substrate 12 can be cancelled out. As a result, since the stress generated at the bond fixing part of the substrate 11 and the substrate 12 can be reduced, warpage deformation and peel-off of the seal member 17 can be further suppressed.

Figure 9:
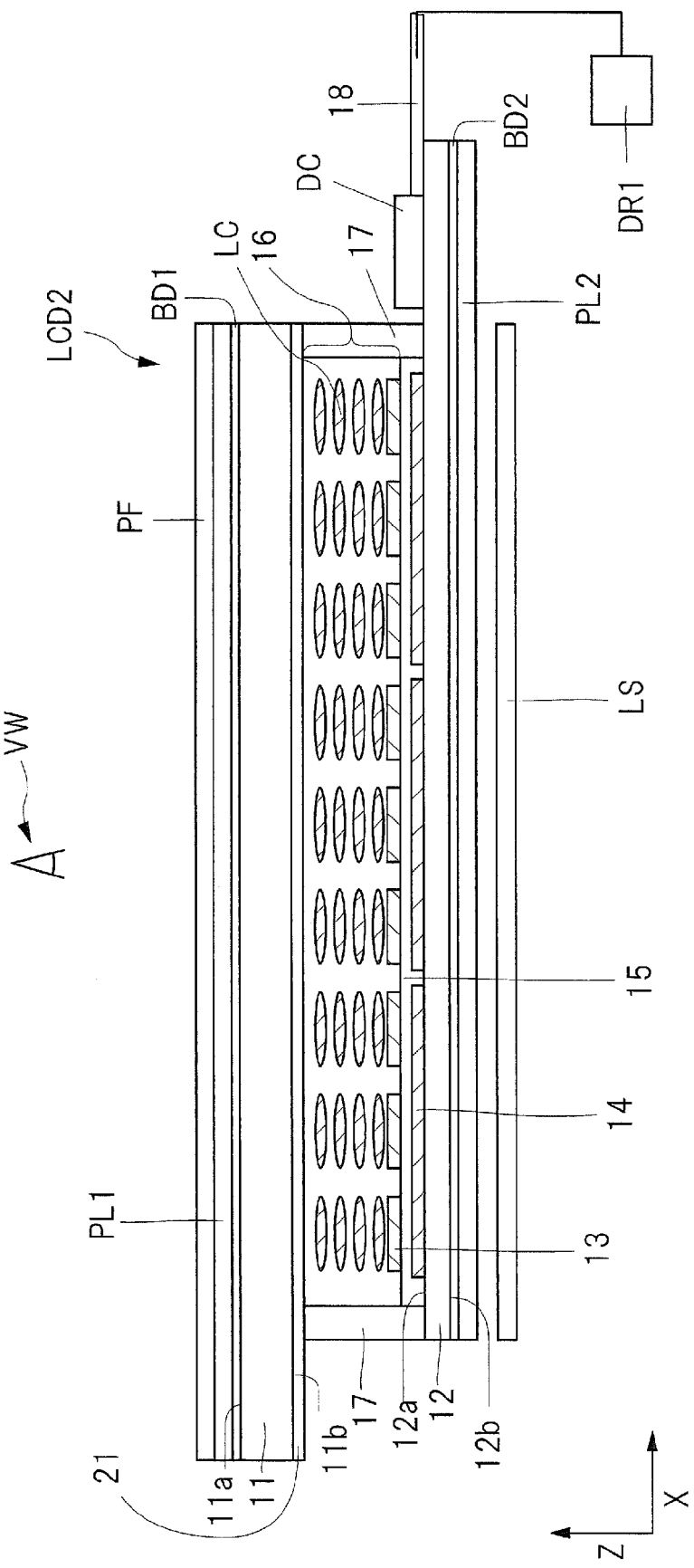
FIG. 9 is a cross-sectional view showing a modification example of FIG. 3.

Also, in the present embodiment, since the substrate 11 is a chemically strengthened glass substrate as described above, it contains alkali components such as sodium ions and potassium ions therein. Therefore, from the viewpoint of suppressing the alkali components comprised in the substrate 11 from affecting the characteristics of the liquid crystal layer 16 shown in FIG. 3, it is preferred to provide a protective film 21, which covers the back surface 11b of the substrate 11, between the substrate 11 and the liquid crystal layer 16 like a display device LCD2 shown in FIG. 9. FIG. 9 is a cross-sectional view showing a modification example of FIG. 3. In the example shown in FIG. 9, the protective film 21 is formed on the substrate 11 so as to cover the back surface 11b. The protective film 21 is a barrier film which suppresses the alkali components comprised in the substrate 11 from diffusing toward the liquid crystal layer 16, and the protective film 21 can be formed by, for example, depositing a film made of silicon oxide or the like by CVD or the like. Alternatively, it can be formed by attaching a resin film. Since the display device LCD2 shown in FIG. 9 has the same structure as the display device LCD1 shown in FIG. 3 except the point that the protective film 21 is provided between the substrate 11 and the liquid crystal layer 16, the redundant descriptions will be omitted.

Although not shown, as a further modification example of FIG. 9, a protective film similar to the protective film 21 can also be formed on the front surface 12a of the substrate 12 shown in FIG. 9. In this case, it is possible to reliably prevent the alkali components comprised in the substrate 11 from diffusing to the front surface 12a side of the substrate 12.

Figure 10:
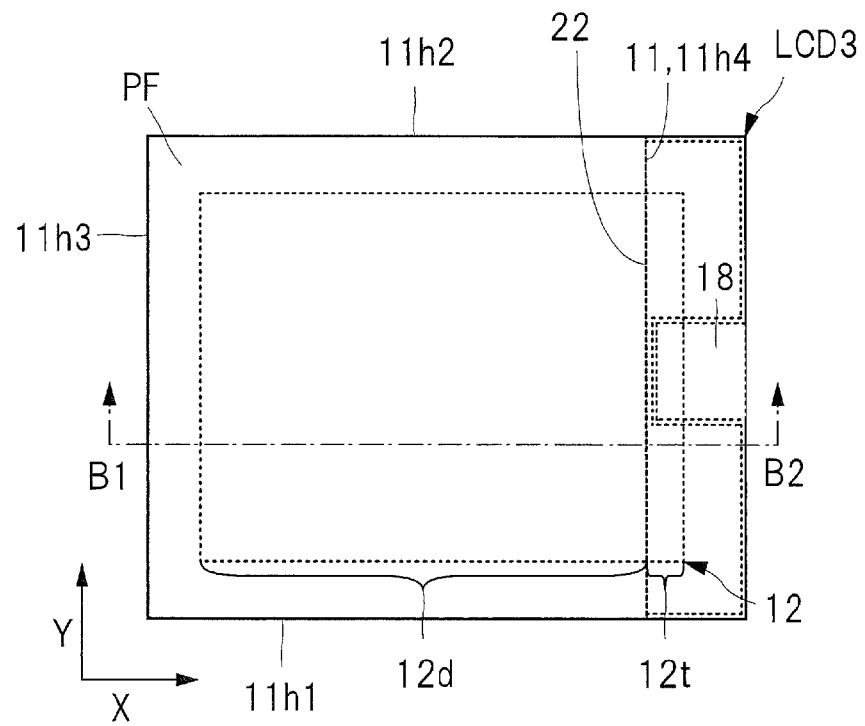
FIG. 10 is a plan view showing a display device which is a modification example of FIG. 1.
Figure 11:
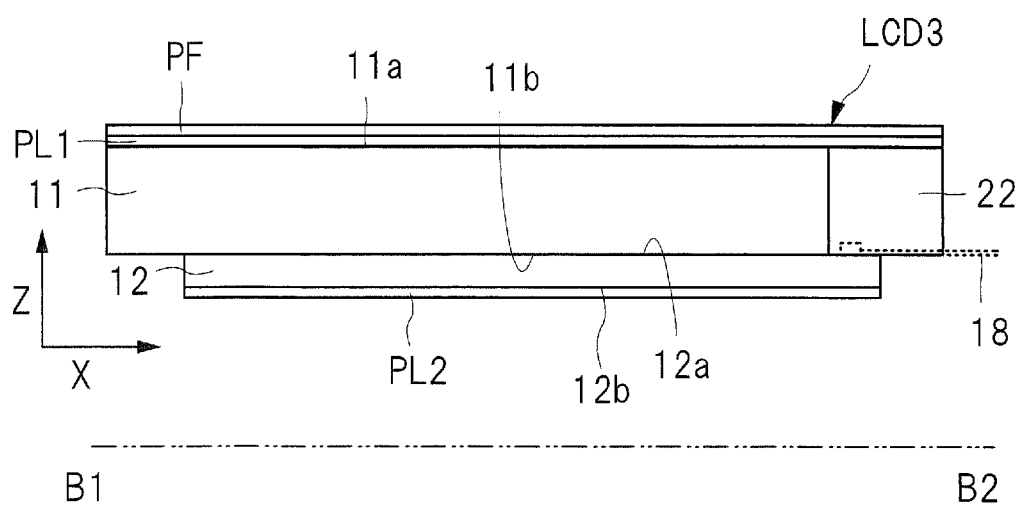
FIG. 11 is a cross-sectional view taken along a line B1-B2 of FIG. 10.

Furthermore, it is also possible to dispose a spacer member 22 at the terminal part 12t which is the region in which the plurality of terminals (not shown) coupled to the semiconductor chip DC and the wiring board 18 are disposed like a display device LCD3 shown in FIG. 10 and FIG. 11. FIG. 10 is a plan view showing the display device which is a modification example of FIG. 1, and FIG. 11 is a cross-sectional view taken along a line B1-B2 of FIG. 10. In the display device LCD3 shown in FIG. 10 and FIG. 11, the spacer member 22 made of resin or glass is bonded and fixed to the terminal part 12t of the substrate 12. Also, the polarization plate PL1 is disposed so as to cross over the substrate 11 and the spacer member 22. Accordingly, as shown in FIG. 10, since the entirety of the front surface 12a of the substrate 12 is covered with the polarization plate PL1, the design thereof can be improved.

Figure 12:
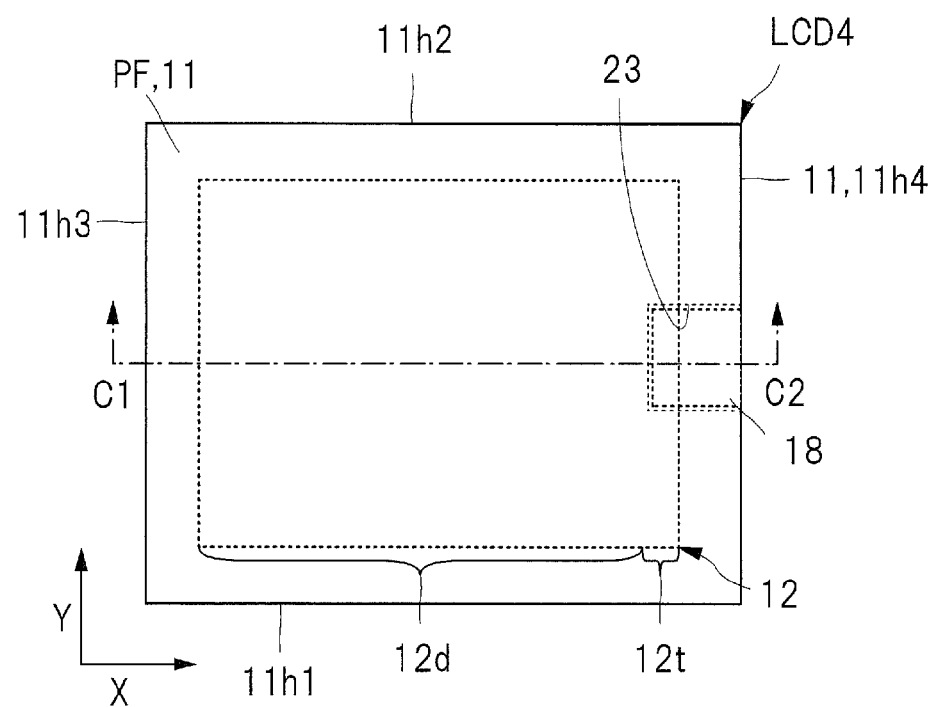
FIG. 12 is a plan view showing a display device which is a modification example of FIG. 10.
Figure 13:
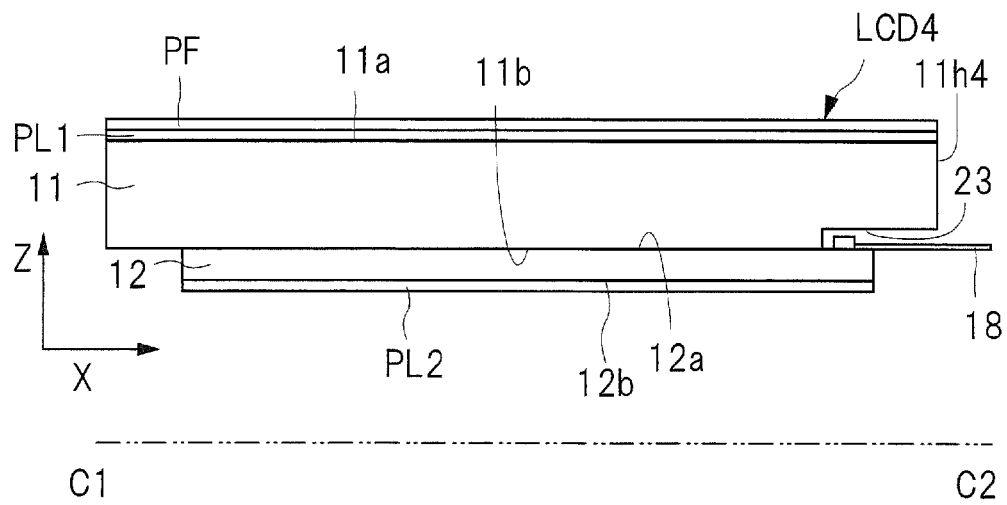
FIG. 13 is a cross-sectional view taken along a line C1-C2 of FIG. 12.

Moreover, the plane area of the substrate 11 can be further increased by forming a terminal housing part 23 serving as a space region at part of the back surface 11b of the substrate 11 and forming the terminal housing part 23 at a position overlapped with the terminal part 12t of the substrate 12 like a display device LCD4 shown in FIG. 12 and FIG. 13. FIG. 12 is a plan view showing the display device which is a modification example of FIG. 10, and FIG. 13 is a cross-sectional view taken along a line C1-C2 of FIG. 12. In the case of the display device LCD4 shown in FIG. 12 and FIG. 13, when seen in a plan view, the side 11h1, the side 11h2, the side 11h3, and the side 11h4 of the substrate 11 are disposed at positions not overlapped with the substrate 12. Specifically, it is different from the above-described display device LCD1 shown in FIG. 1 in the point that the entirety of the side 11h4 is disposed outside the periphery of the substrate 12. As described above, the tensile force which causes the warpage deformation is generated when stress is concentrated due to the difference in heat expansion amounts at the heating of the substrate 11 and the substrate 12 or heat contraction amounts after the heating. Also, the stress generated by heat expansion or heat contraction becomes largest at the periphery of the substrate 11. Therefore, when the substrate 11 is disposed so that the periphery of the substrate 11 is located at the position not overlapped with the substrate 12 when seen inn a plan view like the display device LCD4, the stress applied to the bond fixing part of the substrate 11 and the substrate 12 can be reduced.

In the case of the display device LCD4, the display part 12d and the terminal part 12t are covered with the integrally formed substrate 11. Therefore, compared with the display device LCD3 shown in FIG. 10 and FIG. 11, flatness of the polarization plate PL1 and the bonding surface can be improved. Since the display device LCD3 shown in FIG. 10 and FIG. 11 and the display device LCD4 shown in FIG. 12 and FIG. 13 have the same structure as the display device LCD1 shown in FIG. 3 except the point that the terminal part 12t of the substrate 12 is covered with the polarization plate PL1, redundant descriptions will be omitted.

Figure 14:
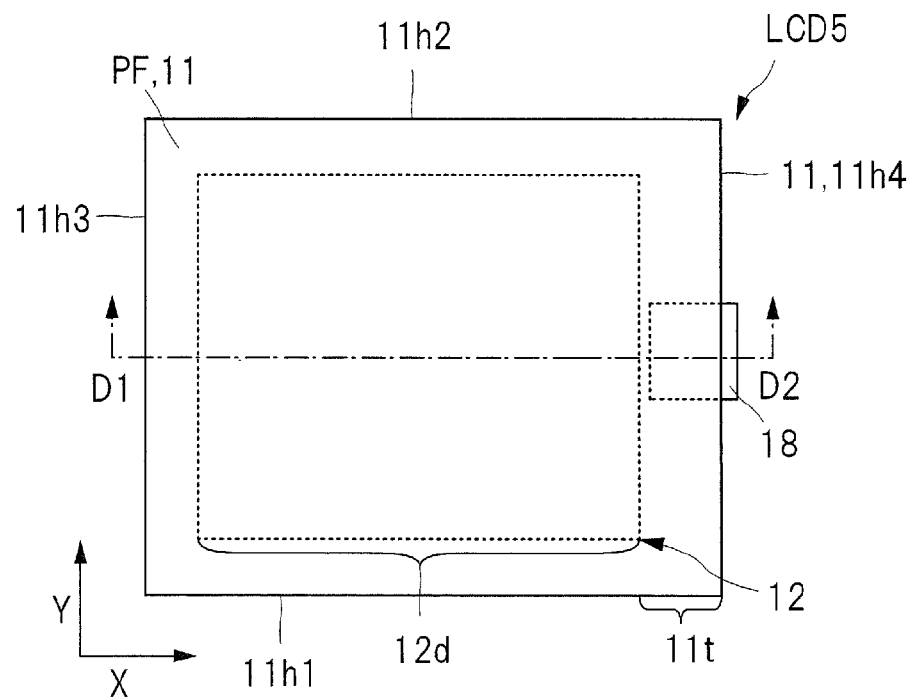
FIG. 14 is a plan view showing a display device which is a modification example of FIG. 12.
Figure 15:
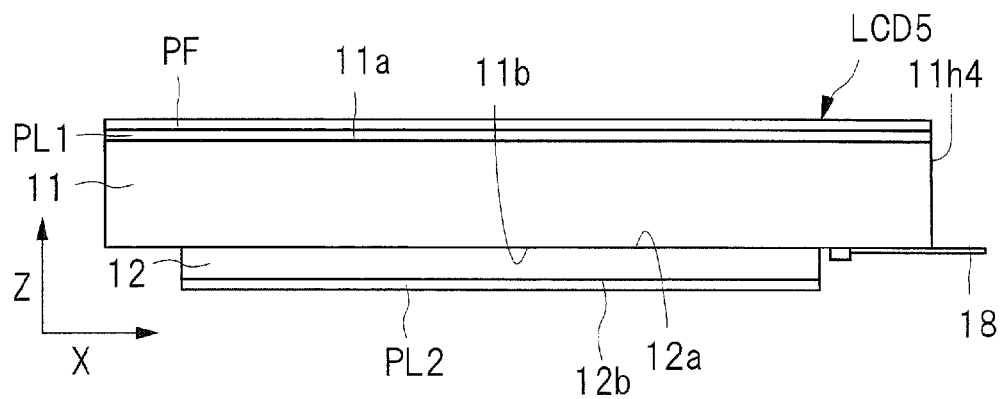
FIG. 15 is a cross-sectional view taken along a line D1-D2 of FIG. 14.

Also, when a terminal part 11t in which a plurality of terminals (not shown) coupled to the semiconductor chip DC (see FIG. 3) and the wiring board 18 are disposed is provided on the back surface 11b of the substrate 11 like a display device LCD5 shown in FIG. 14 and FIG. 15, processing for providing the terminal housing part 23 in the display device LCD4 shown in FIG. 12 and FIG. 13 can be omitted. FIG. 14 is a plan view showing the display device which is a modification example of FIG. 12, and FIG. 15 is a cross-sectional view taken along a line D1-D2 of FIG. 14. Also in the case of the display device LCD5 shown in FIG. 14 and FIG. 15, each of the side 11h1, the side 11h2, the side 11h3, and the side 11h4 of the substrate 11 is disposed at a position not overlapped with the substrate 12 when seen in a plan view. Therefore, effects similar to those of the display device LCD4 shown in FIG. 12 and FIG. 13 can be obtained. Since the display device LCD5 shown in FIG. 14 and FIG. 15 has the same structure as the display device LCD1 shown in FIG. 3 except the point that the substrate 11 is provided with the terminal part 11t and the terminal part 12t (see FIG. 1) of the substrate 12 is omitted, redundant descriptions will be omitted.

<Manufacturing Method of Display Device>

Figure 16:
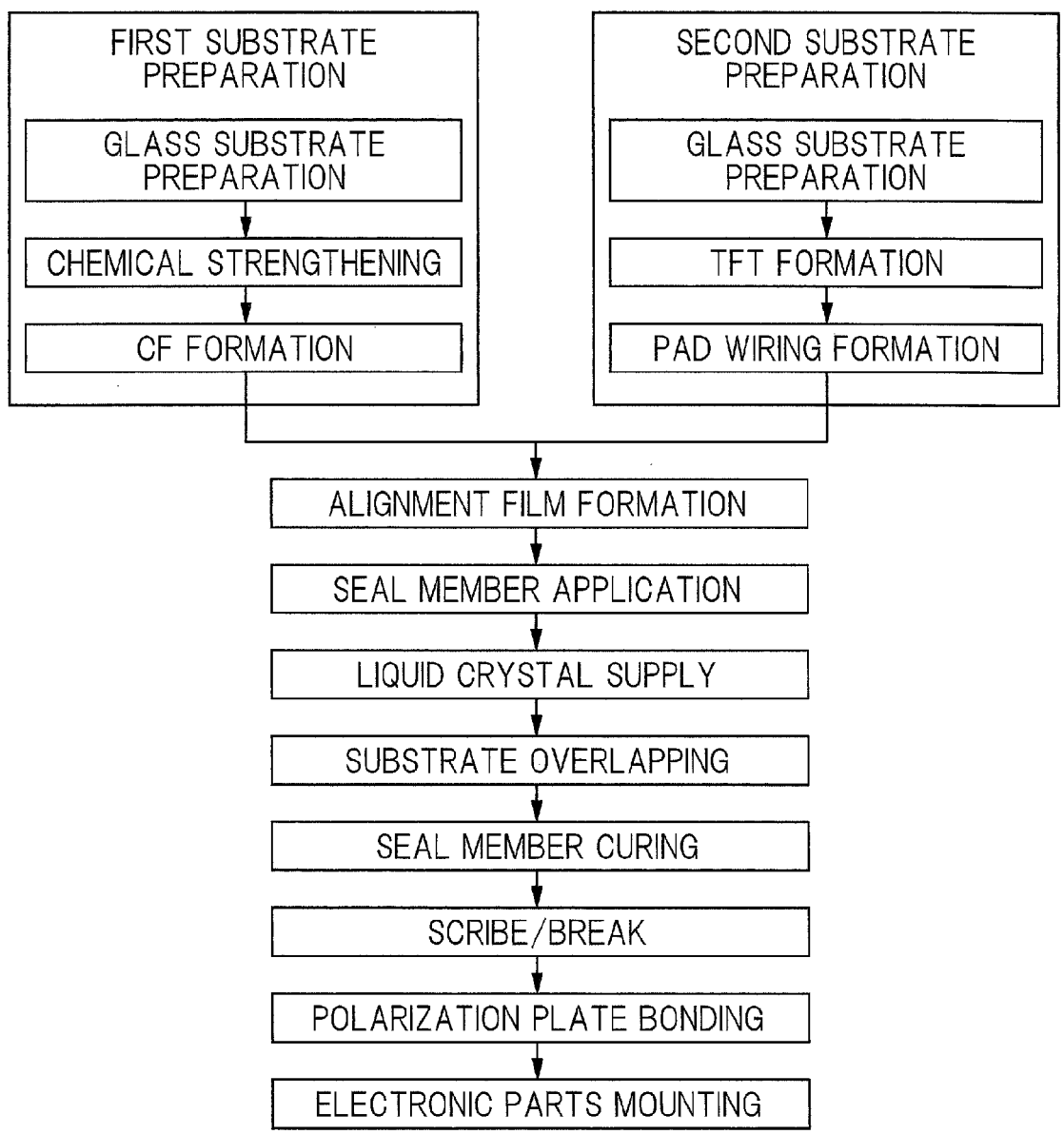
FIG. 16 is an assembly flow chart showing an outline of manufacturing process of the display device shown in FIG. 1 to FIG. 3.

Next, a manufacturing method of the display device described in the present embodiment will be described. In the following descriptions, the manufacturing method of the display device LCD1 shown in FIG. 1 to FIG. 3 is taken as a representative example to be described, and for the other modification examples, differences will be briefly described. FIG. 16 is an assembly flow chart showing an outline of the manufacturing process of the display device shown in FIG. 1 to FIG. 3. The specific members mentioned in the following descriptions will be described by appropriately referencing FIG. 1 to FIG. 15 shown above.

As described with reference to FIG. 6 to FIG. 8, when the diagonal distance of the display region becomes longer, the temperature dependency of the warped distance is increased. Therefore, in the manufacturing process of the display device LCD1, temperature control during the manufacturing process is particularly important from the viewpoint of suppressing warpage deformation. Accordingly, in the following descriptions, the part related to the temperature control of the substrate 11 and the substrate 12 will be described particularly in detail, and the other part will be briefly described.

As shown in FIG. 16, the manufacturing method of the display device of the present embodiment has a first substrate preparing step of preparing the substrate 11 shown in FIG. 3 and a second substrate preparing step of preparing the substrate 12. Also, the manufacturing method of the display device of the present embodiment includes an alignment film forming step, a seal member applying step, a liquid-crystal supplying step, a substrate overlapping step, a seal member curing step, a scribe/break step, and an electronic-part mounting step.

In the first substrate preparing step shown in FIG. 16, a substrate corresponding to the substrate 11 shown in FIG. 3 is prepared. As described above, since the substrate 11 is a chemically strengthened substrate in the present embodiment, a glass substrate is prepared and then is subjected to chemical strengthening treatment. In a CF forming step carried out after the chemical strengthening treatment, the color filter CF (see FIG. 4) is formed on the chemically strengthened substrate 11. In the case where the terminal housing part 23 is to be formed in the substrate 11 like the LCD 4 shown in FIG. 12 and FIG. 13, it is preferred to form the terminal housing part 23 in advance before carrying out the chemical strengthening treatment.

In the second substrate preparing step shown in FIG. 16, a substrate corresponding to the substrate 12 shown in FIG. 3 is prepared. As described above, since the substrate 12 is a so-called alkali-free glass substrate whose concentration of the alkali components comprised in the glass substrate is low (for example, 1 wt % or less) in the present embodiment, a glass substrate different from the glass substrate prepared in the first substrate preparing step is prepared. Also, the second substrate preparing step includes a TFT forming step in which a TFT array is formed on the front surface 12a of the substrate 12. Further, the second substrate preparing step includes a pad wiring forming step in which pad wirings coupled to the TFT array are formed after the TFT forming step. The plurality of terminals (not shown) coupled to the semiconductor chip DC and the wiring board 18 shown in FIG. 3 are formed in this pad wiring forming step. The pad wirings are composed of a plurality of wirings and terminals coupled to the TFT array, the pixel electrodes 13, and the common electrodes 14.

Herein, a transparent electrode material such as ITO is used to form the common electrodes 14 and the pixel electrodes 13, and by heating the common electrodes 14 and the pixel electrodes 13 at a temperature of, for example, about 200° C. or more, the resistance values of the common electrodes 14 and the pixel electrodes 13 can be reduced, or the visible light transmittance thereof can be improved. As described with reference to FIG. 6 to FIG. 8, when the diagonal distance of the display region becomes long, the temperature dependency of the warped distance is increased. Therefore, if the common electrodes 14 and the pixel electrodes 13 are formed in advance before the substrate overlapping step shown in FIG. 16, the common electrodes 14 and the pixel electrodes 13 can be heated at a high temperature.

In the case where the wiring boar 18 is coupled to the substrate 11 like the display device LCD5 shown in FIG. 14 and FIG. 15, a pad wiring forming step is added also to the first substrate preparing step shown in FIG. 16 to form a plurality of terminals (not shown).

In the alignment film forming step shown in FIG. 16, alignment films are formed respectively on the back surface 11b side of the substrate 11 and on the front surface 12a side of the substrate 12 shown in FIG. 3. In the alignment film forming step, the alignment films can be formed by, for example, applying polyimide resin and then rubbing it. Alternatively, it is also possible to apply a photo-alignment method in which the alignment films are formed by selectively reacting polymer chains in a polarizing direction by irradiating a polymer film with polarized ultraviolet rays.

In the seal member applying step shown in FIG. 16, the seal member 17 shown in FIG. 3 is applied so as to surround the periphery of the display region of the substrate 11 or the substrate 12. Also, in the liquid-crystal supplying step shown in FIG. 16, the liquid crystal LC shown in FIG. 3 is dropped so as to fill the display region of the substrate 11 or the substrate 12.

Meanwhile, although not shown, a method in which the liquid crystal LC is injected after the seal member curing step and then a liquid-crystal injection port is sealed can also be employed as a modification example of FIG. 16. However, in this case, since the seal member 17 has to be applied so as to form the liquid-crystal injection port in the seal member applying step, stress tends to concentrate around the liquid-crystal injection port. On the other hand, in the case of the method in which liquid crystal is applied in advance before the substrate overlapping step as shown in FIG. 16, the seal member 17 can be applied in a form in which stress concentration is less likely to occur along the periphery of the display region. In other words, the seal member 17 is seamlessly disposed continuously around the display region in which the display functional layer is disposed. Therefore, from the viewpoint of suppressing peel-off of the seal member 17 due to the stress concentration, it is preferred to carry out the liquid-crystal supplying step before the substrate overlapping step without providing the liquid-crystal injection port.

In the substrate overlapping step shown in FIG. 16, the substrate 11 and the substrate 12 are overlapped so that the back surface 11b of the substrate 11 and the front surface 12a of the substrate 12 shown in FIG. 3 are opposed to each other. At this time, as shown in FIG. 4, the substrates are overlapped so that the plurality of active-element pixels ACp formed on the substrate 12 and the plurality of color-filter pixels CFp of the substrate 11 are opposed to each other. As described above, in order to cause each of the X-direction misalignment distance Gx between the color-filter pixels CFp and the active-element pixels ACp shown in FIG. 5 and the misalignment distance Gy therebetween in the Y direction orthogonal to the X direction to be 5 μm or less, alignment accuracy and temperature control in this step are important. In other words, if the temperature difference between the substrate 11 and the substrate 12 is large when the substrate 11 and the substrate 12 are overlapped with each other, stress is easily generated at the bond fixing part after they are bonded and fixed.

Therefore, in this step, it is preferred to overlap the substrate 11 and the substrate 12 while measuring the temperatures thereof. If the heat expansion amounts of the substrate 11 and the substrate 12 become large while the substrate 11 and the substrate 12 are being overlapped, the misalignment distance Gx and the misalignment distance Gy shown in FIG. 5 tend to be increased. Therefore, it is preferred to carryout this step while controlling the temperatures of the substrate 11 and the substrate 12 to a room temperature (preferably, 20° C. or more to 30° C. or less). It is also preferred to carry out the step while adjusting the temperature so that temperature changes of the substrate 11 and the substrate 12 from start to completion of the overlapping (in other words, until the next seal member curing step is started) are within ±1° C. of an initial temperature.

Figure 17:
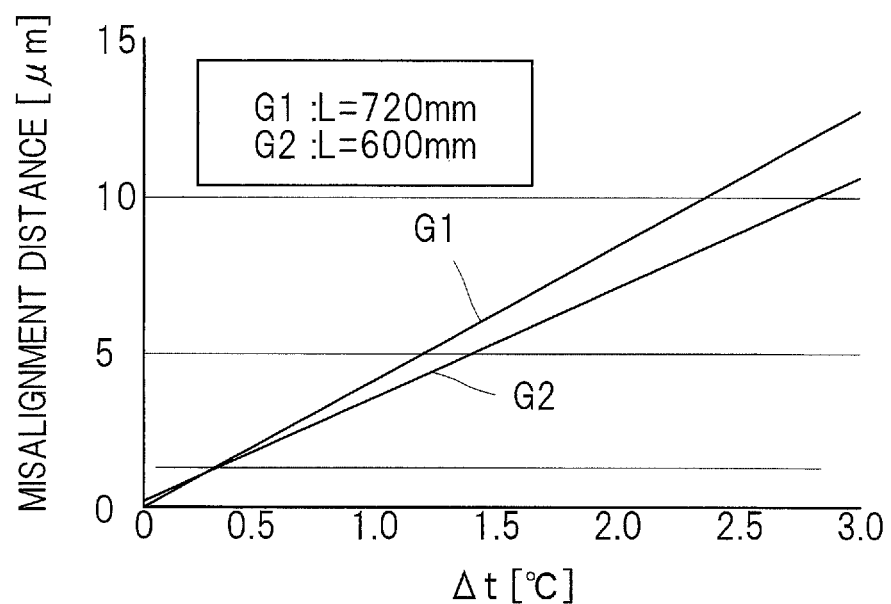
FIG. 17 is an explanatory drawing showing the relation between temperature change and misalignment distance.

As described above, by adjusting the temperatures of the substrate 11 and the substrate 12 in the substrate overlapping step, the misalignment distance Gx and the misalignment distance Gy (see FIG. 4) of the display device LCD1 (see FIG. 3) as a product can be controlled to 5 μm or less. FIG. 17 is an explanatory drawing showing the relation between temperature change and misalignment distance. In FIG. 17, the vertical axis represents the values of the misalignment distance Gx or the misalignment distance Gy shown in FIG. 5. The horizontal axis represents the values of the temperature change. In FIG. 17, it is assumed that the substrate 11 and the substrate 12 shown in FIG. 3 have the same length, and the misalignment distances in the case where the substrate length is 720 mm (symbol G1) and the misalignment distances in the case where the substrate length is 600 mm (symbol G2) are shown.

Also, as the misalignment distances shown in FIG. 17, the results calculated based on the following equation are shown.

$$\text{misalignment distance} = L \times (\rho 1 - \rho 2) \times \Delta t$$

In this equation, the substrate length is L, the linear expansion coefficient of the substrate 11 is ρ1, the linear expansion coefficient of the substrate 12 is ρ2, and the temperature change is Δt.

As shown in FIG. 17, it can be understood that the misalignment distance is increased in proportion to Δt and the misalignment distance can be controlled to 5 μm or less if Δt is controlled to 1° C. or less.

In the seal member curing step shown in FIG. 16, energy is imparted to the seal member 17 shown in FIG. 3 to cure the seal member 17. When the seal member 17 is cured, the substrate 11 and the substrate 12 are bonded and fixed via the seal member 17. Here, as shown in FIG. 6 to FIG. 8, the higher the temperature applied to the substrate 11 and the substrate 12 becomes, the larger the warped distance becomes. Therefore, in this step, it is preferred to cure the seal member 17 at a temperature as low as possible, particularly preferably at 40° C. or less. Accordingly, it is preferred that a material which does not need thermal curing, in other words, a material cured by applying energy other than heat is used for the seal member 17. For example, if the seal member 17 containing ultraviolet curable resin as a main curing component is used, the seal member 17 can be cured at 40° C. or less.

In the scribe/break step shown in FIG. 16, a processing margin of the substrate 11 or the substrate 12 (in other words, an allowance part for processing of the substrate 11 and the substrate 12 which does not remain in a product) is cut and removed. As a result, the outline shape of the display device LCD1 shown in FIG. 1 is obtained. At this time, it is preferred that end faces of the substrate 11 positioned outside the substrate 12 when seen in a plan view (in other words, side surfaces disposed at the periphery) are subjected to polishing process.

In the polarization plate bonding step shown in FIG. 16, the polarization plate PL1 is pasted via the bonding layer BD1 shown in FIG. 3, and the polarization plate PL2 is pasted via the boding layer BD2, thereby bonding and fixing them to the substrate 11 and the substrate 12. The protective film PF shown in FIG. 3 can be pasted to the polarization plate PL1 at arbitrary timing after this step, but from the viewpoint of protecting the polarization plate PL1 during the manufacturing process, it is preferred to paste the protective film PF subsequent to the polarization plate PL1 in this step.

In the electronic-part mounting step shown in FIG. 16, the semiconductor chip DC and the wiring board 18 shown in FIG. 3 are coupled to the plurality of terminals (not shown) formed on the substrate 12. As a result, the pad wirings formed on the substrate 12 are coupled to the wiring board 18.

Through the steps described above, the display device LCD1 (excluding the light source LS) shown in FIG. 3 is obtained. Then, the obtained display device LCD1 with an input device is incorporated in a casing (not shown), and the display device with a casing is completed. The light source LS shown in FIG. 3 can be incorporated in the casing in advance.

Second Embodiment

In the description of the above-described first embodiment, the display device having the image display function has been taken as an example of the display device in which a pair of substrates is disposed to be opposed to each other and bonded and fixed to sandwich a display functional layer therebetween. In recent years, there is a technique in which an input device called a touch panel (also referred to as a touch sensor) is attached to the display surface side of a display device, and when a finger or the like is brought into contact with the touch panel, contact position data is detected and output. In the present embodiment, an embodiment in which the techniques described in the first embodiment are applied to a display device with an input device obtained by attaching a display device and an input device or incorporating an input device in a display device will be described. In the second embodiment, differences from the above-described first embodiment will be mainly described, and redundant descriptions of the structures and others of the display device will be basically omitted.

<Capacitive-Sensing-Type Input Device>

Figure 18:
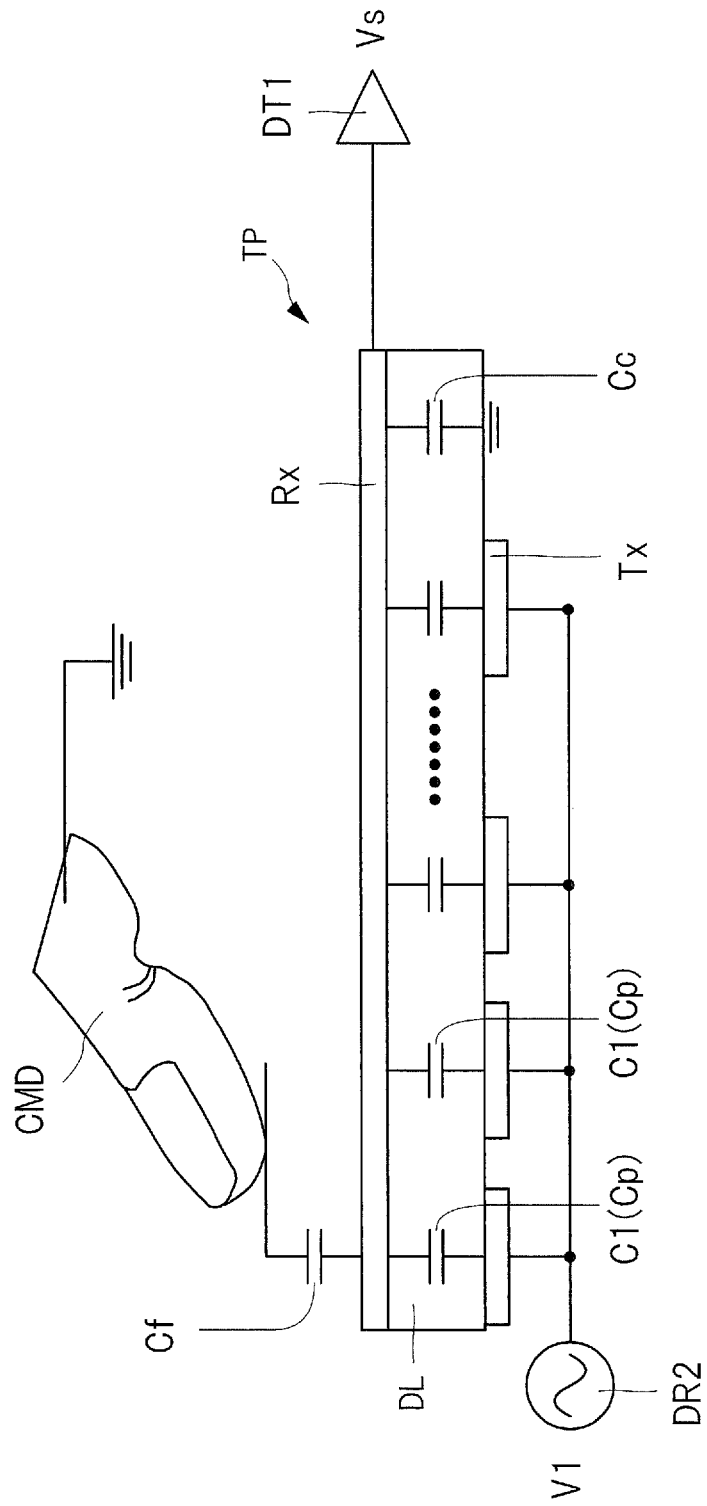
FIG. 18 is an explanatory drawing schematically showing a configuration of a touch panel (input device) of a capacitive sensing type.
Figure 19:
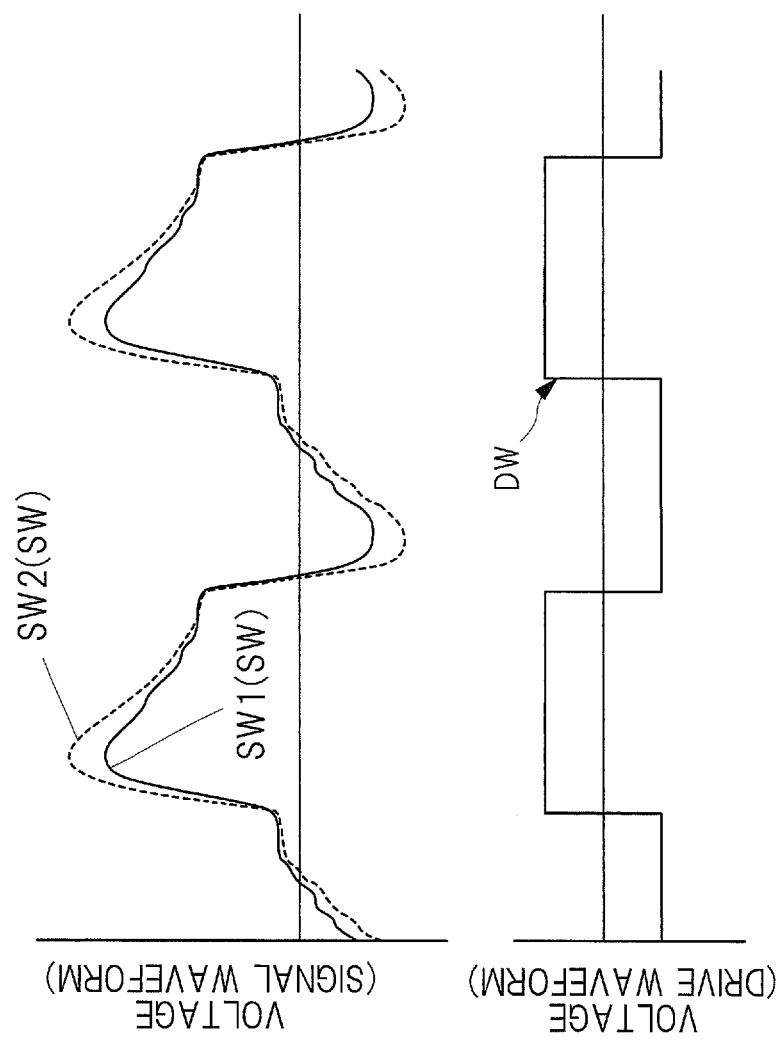
FIG. 19 is an explanatory drawing showing an example of the relation between a drive waveform applied to the touch panel shown in FIG. 18 and signal waveforms output from the touch panel.
Figure 20:
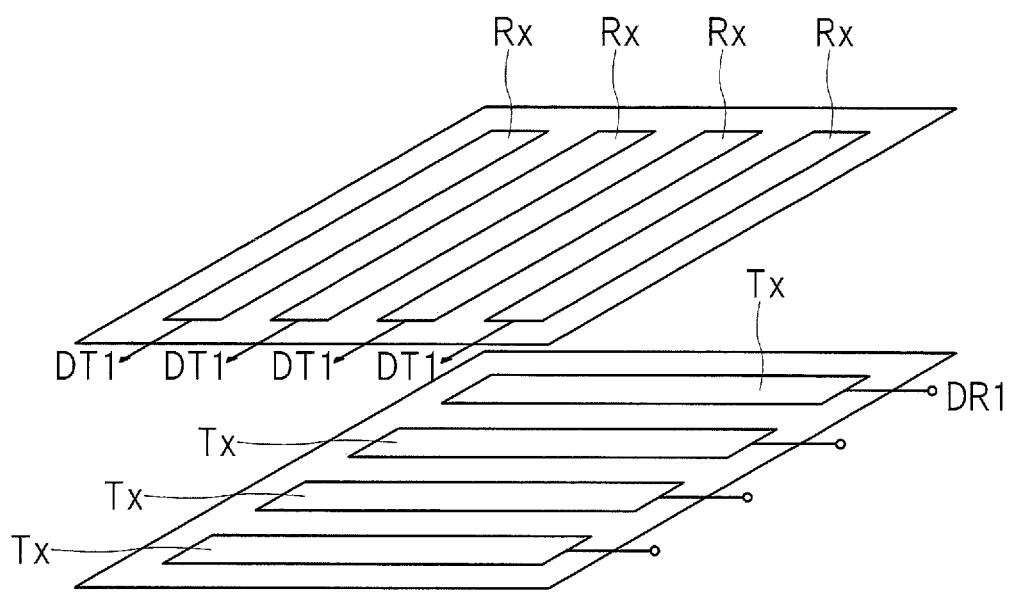
FIG. 20 is an explanatory drawing schematically showing an example of arrangement of drive electrodes and detection electrodes shown in FIG. 18.
Figure 21:
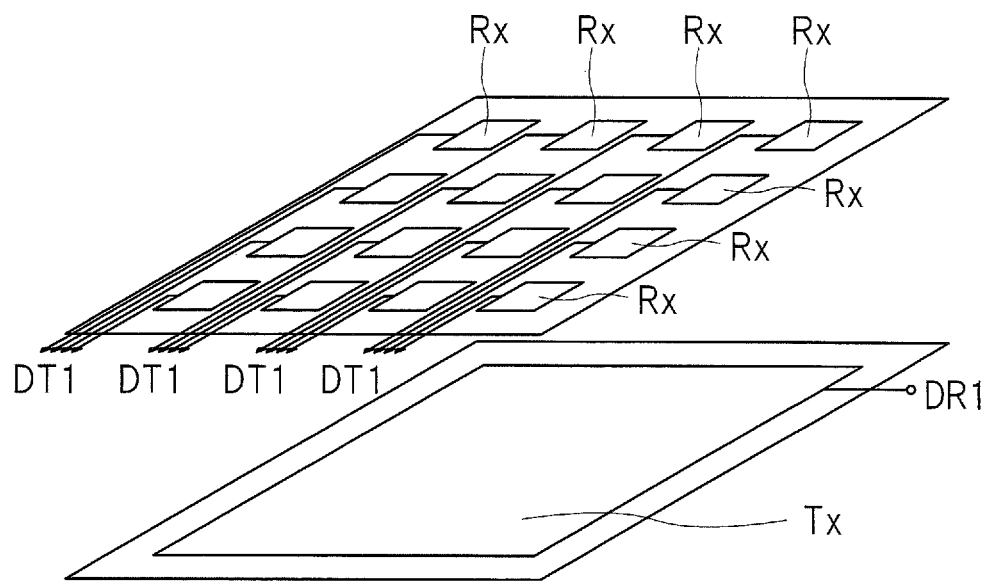
FIG. 21 is an explanatory drawing showing a modification example of FIG. 20.

First, basic operating principles of an input device called a touch panel (or a touch sensor) of a capacitive sensing type will be described. FIG. 18 is an explanatory drawing schematically showing a configuration of the touch panel (input device) of the capacitive sensing type. FIG. 19 is an explanatory drawing showing an example of the relation between a drive waveform applied to the touch panel shown in FIG. 18 and signal waveforms output from the touch panel. In FIG. 19, an example of the drive waveform is shown on a lower side, and an example of the signal waveforms output in accordance with the drive waveform shown on the lower side is shown on an upper side. Also, FIG. 20 is an explanatory drawing schematically showing an example of an arrangement of drive electrodes and detection electrodes shown in FIG. 18, and FIG. 21 is an explanatory drawing showing a modification example of FIG. 20. In FIG. 19, in order to make the difference in waveform between a state in which an input tool CMD shown in FIG. 18 is detected and an undetected state easily understood, the waveform SW1 of the detected case is shown by a solid line and the waveform SW2 of the undetected case is shown by a dotted line.

As shown in FIG. 18, the touch panel (in other words, input device) TP of the capacitive sensing type is provided with a dielectric layer DL and a plurality of capacitive elements C1 constituted of electrode pairs disposed to be opposed to each other via the dielectric layer DL. For example, a drive waveform DW which is a rectangular wave like the example shown on the lower side of FIG. 19 is applied from a drive circuit DR2 for the input device to the drive electrodes Tx constituting one electrodes of the electrode pairs. On the other hand, from the detection electrodes (specifically, input-position detecting electrode) Rx constituting the other electrodes of the electrode pairs, a current corresponding to the drive waveform DW and the electrostatic capacitance of the capacitive elements C1 shown in FIG. 18 flows, and for example, a signal waveform SW like the example shown on the upper side of FIG. 19 is output. The signal waveform SW output from the detection electrode Rx is output to a detection circuit DT1 (see FIG. 18) which detects an input position.

Herein, in the case where an input voltage from the drive circuit DR2 is V1, an output voltage to the detection circuit DT1 at the time when an input tool CMD such as a finger is not being detected is Vs, the capacitance of the plurality of capacitive elements C1 is Cp, the parasitic capacitance of wiring path is Cc, and the number of the capacitive elements C1 is n, an output voltage Vs can be expressed by the following equation.

$$Vs = V1 \times Cp/(n \times Cp + Cc)$$

On the other hand, in the case where the capacitance of the input tool CMD which is a capacitive element (dielectric body) whose one end is coupled to the ground potential such as a finger or a stylus pen is Cf and the output voltage to the detection circuit DT1 at the time when the input tool CMD is detected is Vf, the output voltage Vf can be expressed by the following equation.

$$Vf = V1 \times Cp/(n \times Cp + Cf + Cc)$$

Detection of the input tool CMD is carried out by detecting the difference between the waveform SW1 and the waveform SW2 shown in FIG. 19. Therefore, in the example in which the detection is carried out by using the waveforms of the voltage values as described above, the larger the value of the difference (Vs−Vf) between the output voltage Vs and the output voltage Vf becomes, the more the detection sensitivity can be improved. In other words, the smaller the value of Vf becomes, further in other words, the larger the value of Cf becomes, the more the detection sensitivity can be improved. In the description above, the example of carrying out detection by using the waveforms of the voltages has been shown. However, the detection is carried out in the same manner also in the case of using the waveforms of current values.

Various modes can be applied to the layout of the drive electrodes Tx and the detection electrodes Rx. For example, as shown in FIG. 20, the drive electrodes Tx and the detection electrodes Rx can be disposed in stripes so as to intersect (preferably, orthogonally) with each other. In this case, the drive waveform DW (see FIG. 19) is sequentially applied to the plurality of drive electrodes Tx, and the signal waveform SW (see FIG. 19) is detected at each of the intersecting points of the drive electrodes Tx and the detection electrodes Rx when seen in a plan view. Alternatively, it is also possible to apply the layout in which a conductive film which is not processed into any predetermined shape is used as the drive electrode Tx and the detection electrodes Rx are disposed like a matrix as shown in FIG. 21. Although not shown, it is also possible to apply the mode shown in FIG. 20 and the mode shown in FIG. 21 in combination. Also, capacitive elements can be formed on the same plane by alternately disposing the drive electrodes Tx and the detection electrodes Rx on the same plane.

As described above, there are various modes for the layout of the drive electrodes Tx and the detection electrodes Rx. In any cases, the smaller the distance between the input tool CMD and the detection electrode Rx shown in FIG. 18 becomes, the more the value of the capacitance Cf can be increased, so that the detection sensitivity can be improved. In other words, in the case where a cover glass is attached onto the touch panel TP, the smaller the thickness of the cover glass becomes, the more the detection sensitivity can be improved. If the cover glass can be removed, the detection sensitivity can be significantly improved. More specifically, since the strength of the substrate 11 shown in FIG. 3 can be improved by applying the techniques described in the first embodiment to the display device with an input device, the cover glass can be removed or the thickness of the cover glass can be reduced. As a result, since the distance between the input tool CMD and the detection electrode Rx shown in FIG. 18 can be shortened, the detection sensitivity of the input device can be improved.

<Display Device with Input Device>

Figure 22:
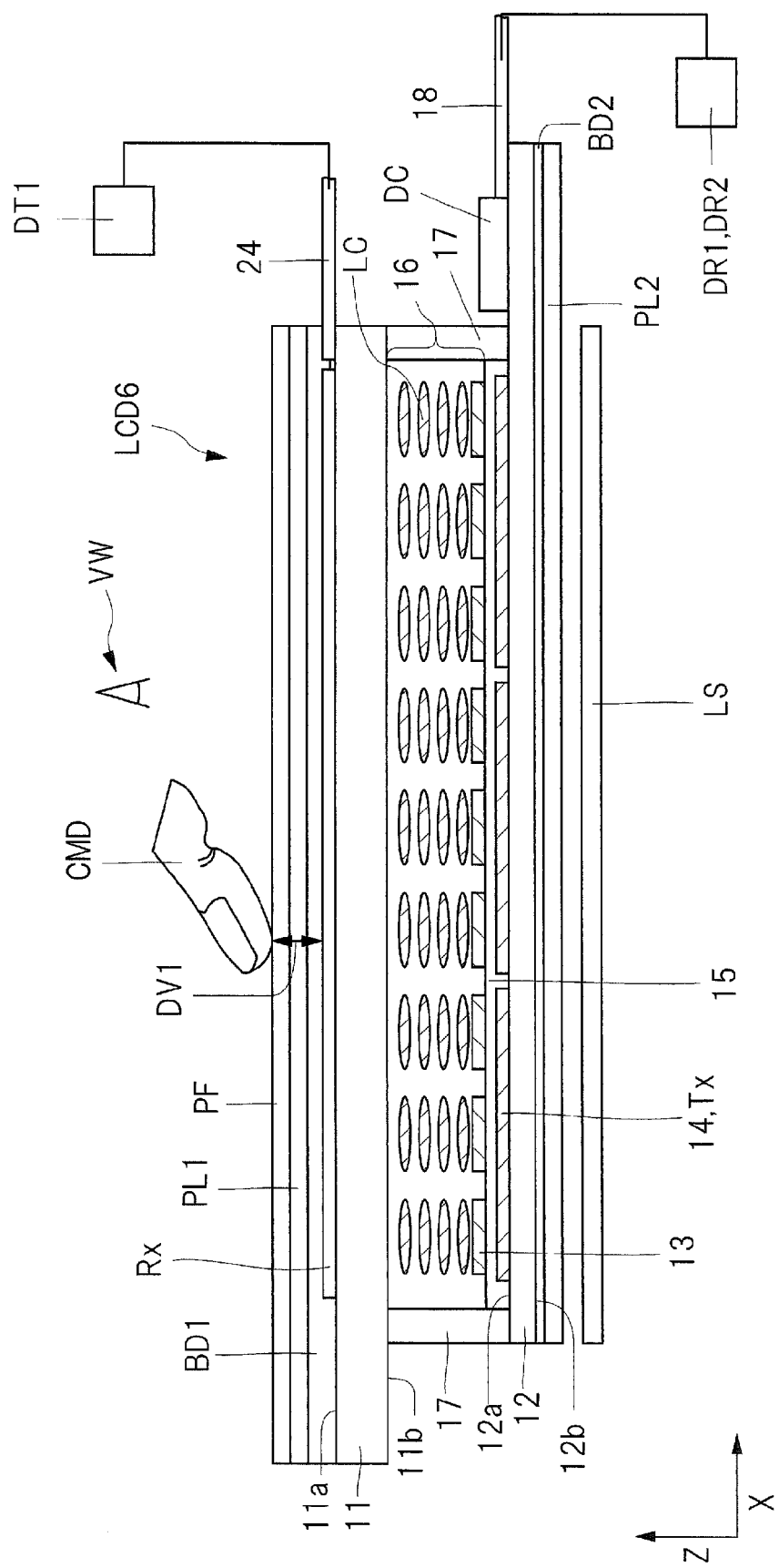
FIG. 22 is a cross-sectional view showing a principal part of a basic structure of an example of a display device with an input device.
Figure 23:
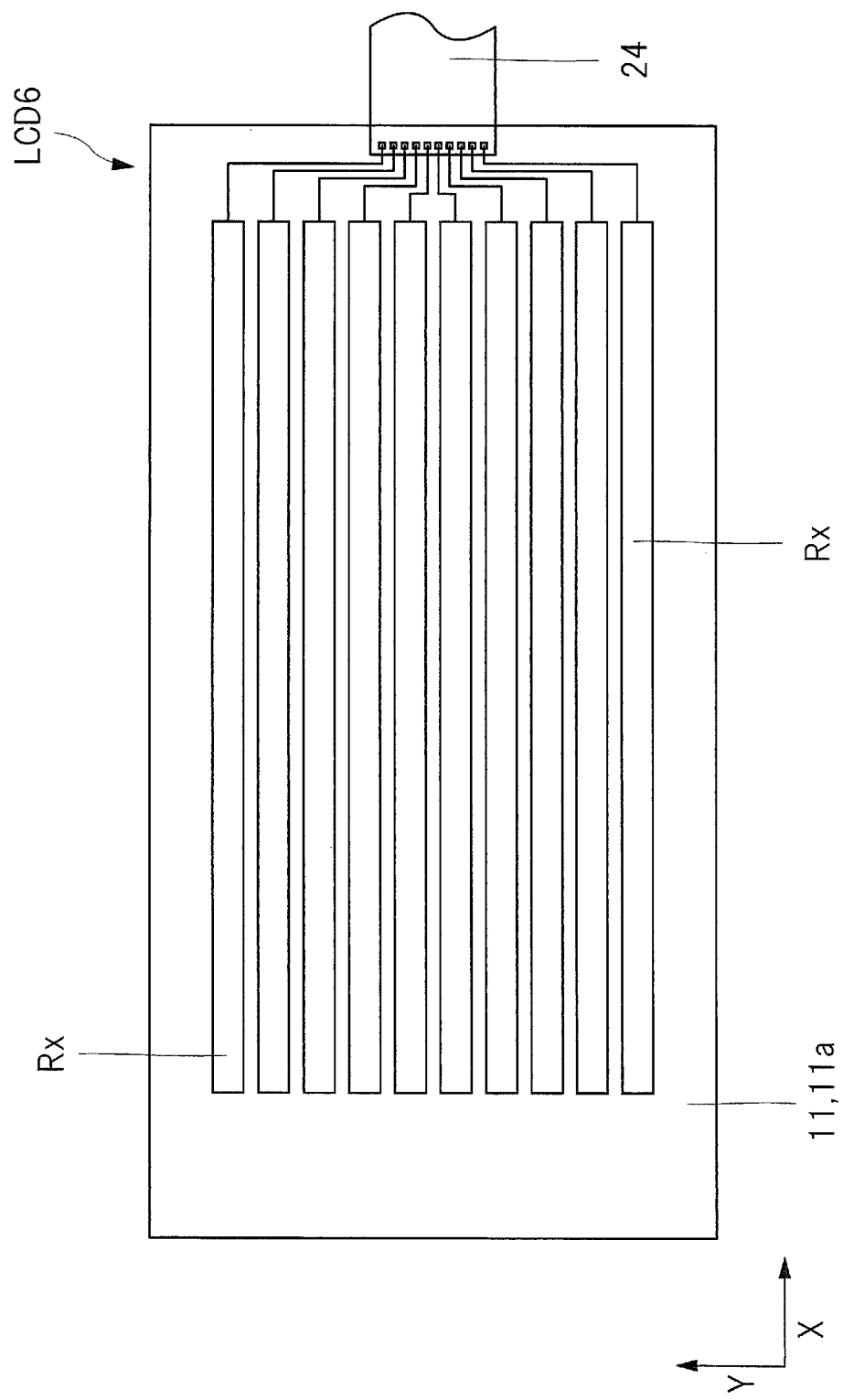
FIG. 23 is a plan view schematically showing an example of a layout of conductor patterns formed on a front surface of a substrate on a display surface side shown in FIG. 22.

Next, the structure of the display device with an input device in which the above-described functions of the input device and the display device are combined will be described. FIG. 22 is a cross-sectional view showing a principal part of a basic structure of an example of the display device with an input device. FIG. 23 is a plan view schematically showing an example of a layout of conductor patterns formed on the front surface of the substrate on the display surface side shown in FIG. 22.

As an application example of the display device with an input device, for example, a structure in which the touch panel TP shown in FIG. 18 is attached to the display device LCD1 shown in FIG. 1 to FIG. 3 is conceivable. However, in the present embodiment, an example applied to an embodiment in which electrodes are shared by the common electrodes 14 of the display device and the drive electrodes Tx of the input device to incorporate the input device in the display device as shown in FIG. 22 will be described. As shown in FIG. 22, in a display device LCD6 in which the input device is incorporated in the display device, the thickness thereof can be reduced by incorporating part of the functions of the input device in the display device.

The display device LCD6 with an input device shown in FIG. 22 is different from the display device LCD1 shown in FIG. 3 in the point that a plurality of conductor patterns are formed on the front surface 11a side of the substrate 11 of the display device LCD1 described with reference to FIG. 1 to FIG. 3. As shown in FIG. 22 and FIG. 23, the plurality of conductor patterns formed on the front surface 11a of the substrate 11 are the detection electrodes Rx for the input device and are made of, for example, translucent electrodes of indium tin oxide (ITO) or zinc oxide.

As shown in FIG. 23, a wiring board 24 is mounted on the front surface 11a of the substrate 11, and the plurality of detection electrodes Rx are coupled to wirings formed on the wiring board 24, respectively. The wiring board 24 is coupled to the detection circuit DT1, and the output voltages output from the detection electrodes Rx are detected by the detection circuit DT1 (see FIG. 22). The wiring board 24 is, for example, a so-called flexible wiring board which has a plurality of wirings formed in a resin film and can be freely deformed in accordance with the shape of an arrangement place.

Also, in the example shown in FIG. 22 and FIG. 23, the drive electrodes Tx described with reference to FIG. 18 are not formed on the substrate 11. In the display device LCD6, as shown in FIG. 22, the drive waveform DW for input-position detection described with reference to FIG. 19 is applied to the common electrodes 14. The drive waveform DW (see FIG. 19) can be applied to the common electrodes 14 via, for example, the wiring board 18 shown in FIG. 22. The common electrodes 14 are coupled to each of the drive circuit DR1 for display drive and a drive circuit DR2 for position-detection drive via the wiring board 18.

However, as described above, there are various modes for the layout of the drive electrodes Tx and the detection electrodes Rx. For example, in the case where the drive electrodes Tx and the detection electrodes Rx are alternately disposed on the same plane to form capacitive elements on the same plane, both of the drive electrodes Tx and the detection electrodes Rx can be formed on the front surface 11a of the substrate 11.

If the structure in which the drive waveform DW for input-position detection is applied to the common electrodes 14 in the above-described manner is expressed in another way, the common electrodes 14 are the electrodes which have both the function as the common electrodes 14 for the display device and the function as the drive electrodes Tx of the input device in the display device LCD6. A method of using the electrodes shared by the common electrodes 14 and the drive electrodes Tx can be realized by, for example, dividing a certain period (or one period) into a touch detecting period (or an input period) and a display writing period. By providing the electrodes shared by the common electrodes 14 for the display device and the drive electrodes Tx of the input device in this manner, the entire thickness of the display device LCD6 with an input device can be reduced.

Also, according to the present embodiment, since supply strength is ensured by improving the strength of the substrate 11, the separation distance DV1 between the input tool CMD and the detection electrodes Rx can be shortened as shown in FIG. 22. In FIG. 22, for making the drawing easy to see, the thickness of the bonding layer BD1 is shown to be larger than the actual thickness, and the thicknesses of the detection electrodes Rx and the bonding layer BD1 are smaller than the thickness of the polarization plate PL1. For example, the thickness of the detection electrode Rx is about 10 nm or more to 500 nm or less, preferably, about 20 nm or more to 350 nm or less. Also, the thickness of the bonding layer BD1 is 5 μm or more to 50 μm or less, preferably, about 10 μm or more to 30 μm or less. Further, the thickness of the polarization plate PL1 is 60 μm or more to 500 μm or less, preferably, 100 μm or more to 300 μm or less. In addition, the thickness of the protective film PF is 10 μm or more to 500 μm or less, preferably, 50 μm or more to 300 μm or less. Therefore, the separation distance DV1 shown in FIG. 22 is 1050 μm or less even in the case of taking the largest values of the above-described ranges. Therefore, when compared with the case where the cover glass is provided, the detection sensitivity of the input device can be significantly improved.

Also, forming conductors such as the detection electrodes Rx on the substrate 11 is preferred from the viewpoint of reducing the stress which is generated due to the difference in the linear expansion coefficient between the substrate 11 and the substrate 12 described in the first embodiment. More specifically, in the case where the detection electrodes Rx are formed on the substrate 11 having the relatively large linear expansion coefficient, the stress which is generated when the substrate 11 is thermally expanded or thermally contracted is dispersed through individual conductor patterns. Therefore, the stress generated in the substrate 11 can be reduced. In other words, in the case where the substrate 11 has the conductive film formed thereon in the substrate heating step, warpage of the substrate 11 and the substrate 12 can be reduced. Also, if a material having a linear expansion coefficient smaller than the linear expansion coefficient of the substrate 11 is used for the material constituting the conductor patterns such as the detection electrodes Rx, since stress can be generated in the direction in which the stress generated due to the difference in the linear expansion coefficient between the substrate 11 and the substrate 12 can be cancelled out, this is preferred in the point that warpage of the substrate 11 and the substrate 12 can be further reduced.

Since the display device LCD6 shown in FIG. 22 and FIG. 23 is similar to the display device LCD1 described with reference to FIG. 1 to FIG. 3 except the above-described differences, redundant descriptions will be omitted. The modification example of the display device LCD1 shown in FIG. 3 is shown as a representative example in FIG. 22 and FIG. 23, but this can be applied in combination with the modification examples described in the first embodiment.

In the case where the display device with an input device is formed in combination with an embodiment of a structure in which the substrate 11 covers the wiring board 18 like the display device LCD4 shown in FIG. 13 or the display device LCD5 shown in FIG. 15, it is preferred to consolidate the wiring board 18 by coupling the plurality of detection electrodes Rx and the wiring board 18 in order to simplify the wiring structure.

Figure 24:
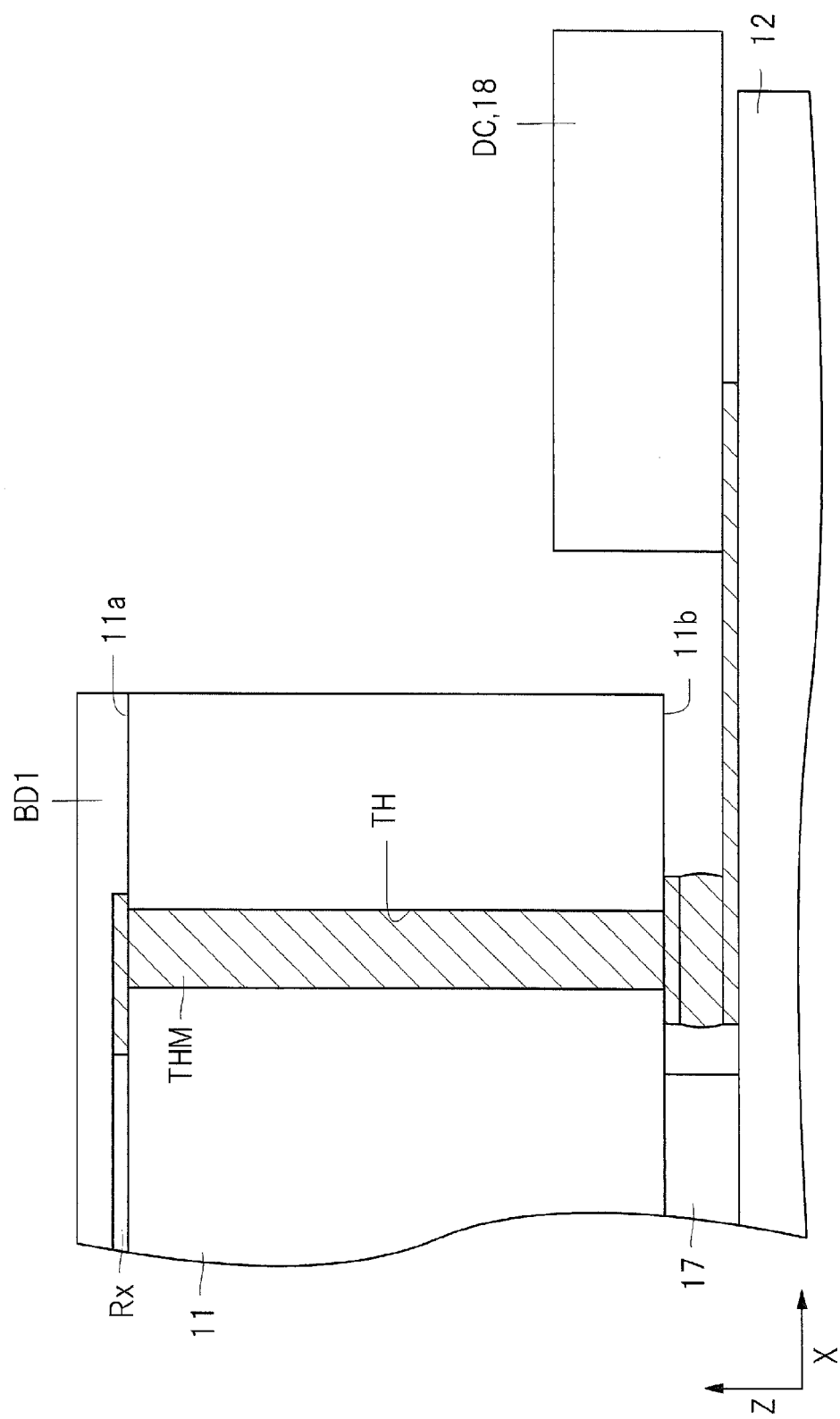
FIG. 24 is an enlarged cross-sectional view showing a modification example of FIG. 22.

For this reason, it is preferred that a through hole TH which penetrates from one of the front surface 11a and the back surface 11b of the substrate 11 to the other surface is formed to couple the conductor pattern formed on the front surface 11a of the substrate 11 and the wiring board 18 via a conductor THM embedded in the through hole TH as shown in FIG. 24. FIG. 24 is an enlarged cross-sectional view showing a modification example of FIG. 22. In FIG. 24, in order to make the conducting path coupling the detection electrode Rx and the wiring board 18 easily understood, the conducting path is shown with hatching.

The display device with an input device of the second embodiment is similar to the display device described in the first embodiment except the above-described differences. Also, a manufacturing method of the display device with an input device is similar to the manufacturing method of the display device described in the first embodiment except that the first substrate preparing step shown in FIG. 16 includes a step of forming conductor patterns such as the detection electrodes Rx and a step of forming the through hole TH shown in FIG. 24 and embedding the conductor THM therein. Therefore, redundant descriptions will be omitted.

Other Modification Examples

In the foregoing, the invention made by the inventors of the present application has been concretely described based on the embodiments. However, it is needless to say that the present invention is not limited to the foregoing embodiments and various modifications and alterations can be made within the scope of the present invention.

For example, in the above-described embodiments, the embodiment in which the polarization plate PL1 is covered with the protective film PF made of, for example, resin as a protective layer which protects the polarization plate PL1 from damage, stains, and others has been described. However, a glass plate can also be used as the protective layer. When the techniques described in the embodiments above are applied, the strength of the substrate 11 can be improved and the strength required for the display device can be ensured. Therefore, even when the glass plate is used as the protective layer, the thickness of the glass plate can be reduced.

Also, in the above-described first and second embodiments, the display device of the lateral electric field mode (specifically, FFS mode) has been taken as an example of the display device. However, the invention can be applied also to a display device of the vertical electric field mode.

Further, in the above-described first and second embodiments, various modification examples have been described, and the above-described modification examples can be applied in combination.

Also, in the above-described embodiments, the liquid crystal display device has been taken as an example of the display device in which a pair of substrates is bonded and fixed so as to sandwich a display functional layer. However, the invention can be applied also to display devices such as an organic EL display and a plasma display other than the liquid crystal display device.

The organic EL display panel has a structure in which an organic EL layer is sandwiched by a cathode and an anode from both sides, and electrons and holes are injected into the organic EL layer by applying a voltage to the cathode and the anode. In the organic EL display panel, the electrons and the holes injected into the organic EL layer are re-coupled, and electron energy of the organic molecules constituting the organic EL layer makes a transition from a ground state to an excited state by the energy generated by the re-coupling and light is then emitted when the electron energy of the organic molecules returns from the excited state to the ground state. A display panel utilizing this phenomenon is the organic EL display panel. The organic EL layer includes necessary layers among a light-emitting layer, a carrier injecting layer, a carrier transporting layer, and others.

Also, a plasma display panel has a structure in which opposed electrodes are disposed in a sealed pixel space and the interior of the pixel space is filled with gas, and the discharge is generated by applying a voltage between the opposed electrodes. Then, in the plasma display panel, the gas is transformed into a plasma state by energy generated by the discharge, and a fluorescent substance which is applied onto the inner side of the pixel space is irradiated with the ultraviolet rays generated when the gas in the plasma state returns to the gas of the original state, thereby generating visible light. A display panel utilizing this phenomenon is the plasma display panel.

However, in the case of the plasma display panel, since there is no need to form the TFT layer on one of the substrates, chemically strengthened substrates can be used for both of the pair of substrates bonded and fixed so as to sandwich the pixel space including a fluorescent layer. Therefore, the techniques described in the embodiments above are particularly effective when applied to a display device in which the TFT layer is formed on one of the substrates like the liquid crystal display device or the organic EL display.

The present invention can be widely applied to various display devices and electronic equipment in which display devices are incorporated.

What is claimed is:

1. A display device comprising:
   a first substrate;
   a second substrate bonded to the first substrate to be opposed to the first substrate;
   a display functional layer disposed between the first substrate and the second substrate; and
   a bond fixing part disposed around the display functional layer and bonding the first substrate and the second substrate,
   wherein
   a linear expansion coefficient of the first substrate is larger than a linear expansion coefficient of the second substrate, a thickness of the first substrate is larger than a thickness of the second substrate, an area of the first substrate is larger than an area of the second substrate, the first substrate is a glass substrate including an alkali component at a first concentration, the second substrate is a glass substrate including an alkali component at a second concentration lower than the first concentration or a glass substrate including no alkali component, a barrier film which covers an entire surface of a display functional layer side of the first substrate is disposed on the first substrate, the second substrate has a thin film transistor, a display part, and a terminal part to which a signal for driving the thin film transistor is input, the first substrate has a first side extending along a first direction, a second side opposed to the first side, a third side intersecting with the first and second sides, and a fourth side opposed to the third side when seen in a plan view, the first side, the second side, and the third side are disposed at positions not overlapped with the second substrate when seen in a plan view, the first substrate has a first surface opposed to the display functional layer and a second surface positioned on an opposite side of the first surface, the second substrate has a third surface opposed to the display functional layer and a fourth surface positioned on an opposite side of the third surface, a first polarization plate is bonded to the second surface of the first substrate via a first bonding layer, a second polarization plate is bonded to the fourth surface of the second substrate via a second bonding layer, and an elastic modulus of the first bonding layer is larger than that of the second bonding layer.

2. The display device according to claim 1, wherein the first side, the second side, the third side, and the fourth side are respectively disposed at positions not overlapped with the second substrate when seen in a plan view.

3. The display device according to claim 2, wherein the second substrate has the display part having a display region and the terminal part disposed next to the display part and having a plurality of terminals disposed therein, and a terminal housing part housing the plurality of terminals is formed in a region of the first surface of the first substrate, the region being overlapped with the terminal part of the second substrate.

4. The display device according to claim 2, wherein a plurality of terminals is formed on the first surface of the first substrate.

5. The display device according to claim 1, wherein a plurality of conductor patterns is formed on the second surface of the first substrate.

6. The display device according to claim 5, wherein a through hole penetrating from one of the first surface and the second surface to the other surface is formed in the first substrate, and the plurality of conductor patterns are coupled to a conductor embedded in the through hole.

7. The display device according to claim 1, wherein the second substrate has the display part having a display region and the terminal part disposed next to the display part and having a plurality of terminals disposed therein, and a spacer member is disposed in the terminal part.

8. The display device according to claim 1, wherein a protective layer for protecting the first polarization plate is formed.

9. The display device according to claim 1, wherein color filters in which first pixels of a plurality of colors are cyclically arranged are formed on the first substrate, a plurality of second pixels disposed to be opposed to the first pixels of the plurality of colors, respectively, are formed on the second substrate, and a misalignment distance between the first pixels of the plurality of colors and the plurality of second pixels is 5 μm or less when seen in a plan view.

10. The display device according to claim 1, wherein a seal member disposed at the bond fixing part is made of a material that is cured by applying energy other than heat.

11. The display device according to claim 1, wherein a seal member disposed at the bond fixing part is seamlessly disposed continuously around a display region in which the display functional layer is disposed.

* * * * *